United States Patent
Harai

(10) Patent No.: US 12,249,972 B2
(45) Date of Patent: Mar. 11, 2025

(54) ACOUSTIC WAVE RESONATOR, FILTER, AND MULTIPLEXER

(71) Applicant: TAIYO YUDEN CO., LTD., Tokyo (JP)

(72) Inventor: Shodai Harai, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 402 days.

(21) Appl. No.: 17/713,590

(22) Filed: Apr. 5, 2022

(65) Prior Publication Data
US 2022/0352871 A1    Nov. 3, 2022

(30) Foreign Application Priority Data

Apr. 30, 2021 (JP) .................................. 2021-077435

(51) Int. Cl.
*H03H 9/02* (2006.01)
*H03H 9/145* (2006.01)
(Continued)

(52) U.S. Cl.
CPC ........ *H03H 9/02818* (2013.01); *H03H 9/145* (2013.01); *H03H 9/25* (2013.01); *H03H 9/6483* (2013.01); *H03H 9/72* (2013.01)

(58) Field of Classification Search
CPC ...... H03H 9/02818; H03H 9/145; H03H 9/25; H03H 9/6483; H03H 9/72; H03H 9/02559
See application file for complete search history.

(56) References Cited

U.S. PATENT DOCUMENTS

2014/0001919 A1*  1/2014  Komatsu ............ H03H 9/02818
                                                    310/313 B
2015/0070227 A1*  3/2015  Kishino ............... H03H 9/0576
                                                    333/133
(Continued)

FOREIGN PATENT DOCUMENTS

JP    H 10-022765 A    1/1998
JP    2005-159835 A    6/2005
(Continued)

OTHER PUBLICATIONS

Notification of Reasons for Refusal issued on Oct. 22, 2024 in a counterpart Japanese Patent Application No. 2021-077435.

*Primary Examiner* — Luke D Ratcliffe
*Assistant Examiner* — Christopher Richard Walker
(74) *Attorney, Agent, or Firm* — Stein IP, LLC

(57) ABSTRACT

An acoustic wave resonator includes two comb-shaped electrodes provided on a piezoelectric substrate, each of the comb-shaped electrodes including electrode fingers and a bus bar coupled to the electrode fingers, an acoustic velocity of an acoustic wave propagating through a gap region, which is located between tips of electrode fingers of one of the comb-shaped electrodes and a bus bar of the other of the comb-shaped electrodes, being equal to or greater than 0.98 times and equal to or less than 1.02 times an acoustic velocity of an acoustic wave propagating through an edge region located in an edge in an extension direction of the electrode fingers in an overlap region, and an additional film that is provided over the piezoelectric substrate from the edge region to the gap region and is not provided in a center region located further in than the edge region in the overlap region.

16 Claims, 16 Drawing Sheets

(51) Int. Cl.
*H03H 9/25* (2006.01)
*H03H 9/64* (2006.01)
*H03H 9/72* (2006.01)

(56) References Cited

U.S. PATENT DOCUMENTS

| | | | |
|---|---|---|---|
| 2015/0123746 A1* | 5/2015 | Nakamura | H03H 9/02818 |
| | | | 333/195 |
| 2017/0170808 A1* | 6/2017 | Iwaki | H03H 9/14532 |
| 2017/0324394 A1* | 11/2017 | Ebner | H03H 9/02992 |
| 2018/0375491 A1* | 12/2018 | Iwaki | H03H 9/02858 |
| 2020/0162052 A1* | 5/2020 | Matsuoka | H03H 3/08 |
| 2021/0067134 A1 | 3/2021 | Fujiwara | H03H 9/145 |
| 2022/0286105 A1* | 9/2022 | Goto | H03H 9/175 |

FOREIGN PATENT DOCUMENTS

| | | |
|---|---|---|
| JP | 2009-278429 A | 11/2009 |
| JP | 2015-89069 A | 5/2015 |
| JP | 2016-26444 A | 2/2016 |
| JP | 2016-178387 A | 10/2016 |
| JP | 2017-538365 A | 12/2017 |
| JP | 2020-080519 A | 5/2020 |
| JP | 2020-88459 A | 6/2020 |

* cited by examiner

ACOUSTIC WAVE RESONATOR, FILTER, AND MULTIPLEXER

CROSS-REFERENCE TO RELATED APPLICATION

This application is based upon and claims the benefit of priority of the prior Japanese Patent Application No. 2021-077435, filed on Apr. 30, 2021, entire contents of which are incorporated herein by reference.

FIELD

A certain aspect of the present embodiments relates to an acoustic wave resonator, a filter, and a multiplexer.

BACKGROUND

In high-frequency communication systems typified by mobile phones, high-frequency filters are used to remove unnecessary signals other than the signals in the frequency band used for communication. The acoustic wave resonator such as the surface acoustic wave resonator is used in the high-frequency filter. As one of methods for reducing spurious emissions without impairing the Q factor, the acoustic wave resonator using the piston mode is known as disclosed in, for example, Japanese Patent Application Publication Nos. 2020-80519 and 2020-88459.

SUMMARY

In the piston mode, the edge region of the overlap region may be made to be the low acoustic velocity region where the acoustic velocity of the acoustic wave is lower than the acoustic velocity of the acoustic wave in the center region located further in than the edge region, and the gap region located further out than the edge region may be made to be the high acoustic velocity region where the acoustic velocity of the acoustic wave is higher than the acoustic velocity of the acoustic wave in the center region. In this case, the adjustments to achieve the piston-mode excitation is complicated.

According to a first aspect of the present disclosure, there is provided an acoustic wave resonator including: a piezoelectric substrate; a pair of comb-shaped electrodes provided on the piezoelectric substrate, each of the comb-shaped electrodes including electrode fingers and a bus bar to which the electrode fingers are coupled, an acoustic velocity of an acoustic wave propagating through a gap region being equal to or greater than 0.98 times an acoustic velocity of an acoustic wave propagating through an edge region and equal to or less than 1.02 times the acoustic velocity of the acoustic wave propagating through the edge region, the gap region being a first region of a region located between tips of the electrode fingers of one of the comb-shaped electrodes and the bus bar of the other of the comb-shaped electrodes, the first region being provided with no metal film electrically connected to the bus bar of the other of the comb-shaped electrodes, the edge region being a region located in an edge in an extension direction of the electrode fingers in an overlap region, the overlap region being a region where the electrode fingers of the one of the comb-shaped electrodes and the electrode fingers of the other of the comb-shaped electrodes overlap; and an additional film that is provided over the piezoelectric substrate from the edge region to the gap region and is not provided in a center region that is a region located further in than the edge region in the overlap region.

According to a second aspect of the present disclosure, there is provided an acoustic wave resonator including: a piezoelectric substrate; a pair of comb-shaped electrodes provided on the piezoelectric substrate, each of the comb-shaped electrodes including electrode fingers and a bus bar to which the electrode fingers are coupled, tips of the electrode fingers of one of the comb-shaped electrodes and the bus bar of the other of the comb-shaped electrodes being opposite to each other; a first additional film that is provided on the piezoelectric substrate between each of the tips of the electrode fingers of the one of the comb-shaped electrodes and the bus bar of the other of the comb-shaped electrodes, and is mainly composed of silicon oxide, tantalum oxide, niobium oxide, aluminum, or titanium; and a second additional film that is provided over the piezoelectric substrate from an edge region to a gap region, and is not provided in a center region, the edge region being a region located in an edge in an extension direction of the electrode fingers in an overlap region, the gap region being a region located between the tips of the electrode fingers of one of the comb-shaped electrodes and the bus bar of the other of the comb-shaped electrodes, the center region being a region located further in than the edge region in the overlap region, the overlap region being a region where the electrode fingers of the one of the comb-shaped electrodes and the electrode fingers of the other of the comb-shaped electrodes overlap.

According to a third aspect of the present disclosure, there is provided an acoustic wave resonator including: a piezoelectric substrate; a pair of comb-shaped electrodes provided on the piezoelectric substrate, each of the comb-shaped electrodes including electrode fingers, dummy electrode fingers, and a bus bar to which the electrode fingers and the dummy electrode fingers are coupled, tips of the electrode fingers of one of the comb-shaped electrodes and tips of the dummy electrode fingers of the other of the comb-shaped electrodes being opposite to each other; a first additional film that is provided on the piezoelectric substrate between each of the tips of the electrode fingers of the one of the comb-shaped electrodes and a corresponding one of the tips of the dummy electrode fingers of the other of the comb-shaped electrodes, and is mainly composed of silicon oxide, tantalum oxide, niobium oxide, aluminum, or titanium; and a second additional film that is provided over the piezoelectric substrate from an edge region to a gap region, and is not provided in a center region, the edge region being a region located in an edge in an extension direction of the electrode fingers in an overlap region, the gap region being a region located between the tips of the electrode fingers of the one of the comb-shaped electrodes and the tips of the dummy electrode fingers of the other of the comb-shaped electrodes, the center region being a region located further in than the edge region in the overlap region, the overlap region being a region where the electrode fingers of the one of the comb-shaped electrodes and the electrode fingers of the other of the comb-shaped electrodes overlap.

According to a fourth aspect of the present disclosure, there is provided a filter including the above acoustic wave resonator.

According to a fifth aspect of the present disclosure, there is provided a multiplexer including the above filter.

DETAILED DESCRIPTION

Hereinafter, embodiments of the present disclosure will be described with reference to the accompanying drawings.

First Embodiment

Figure 1A:
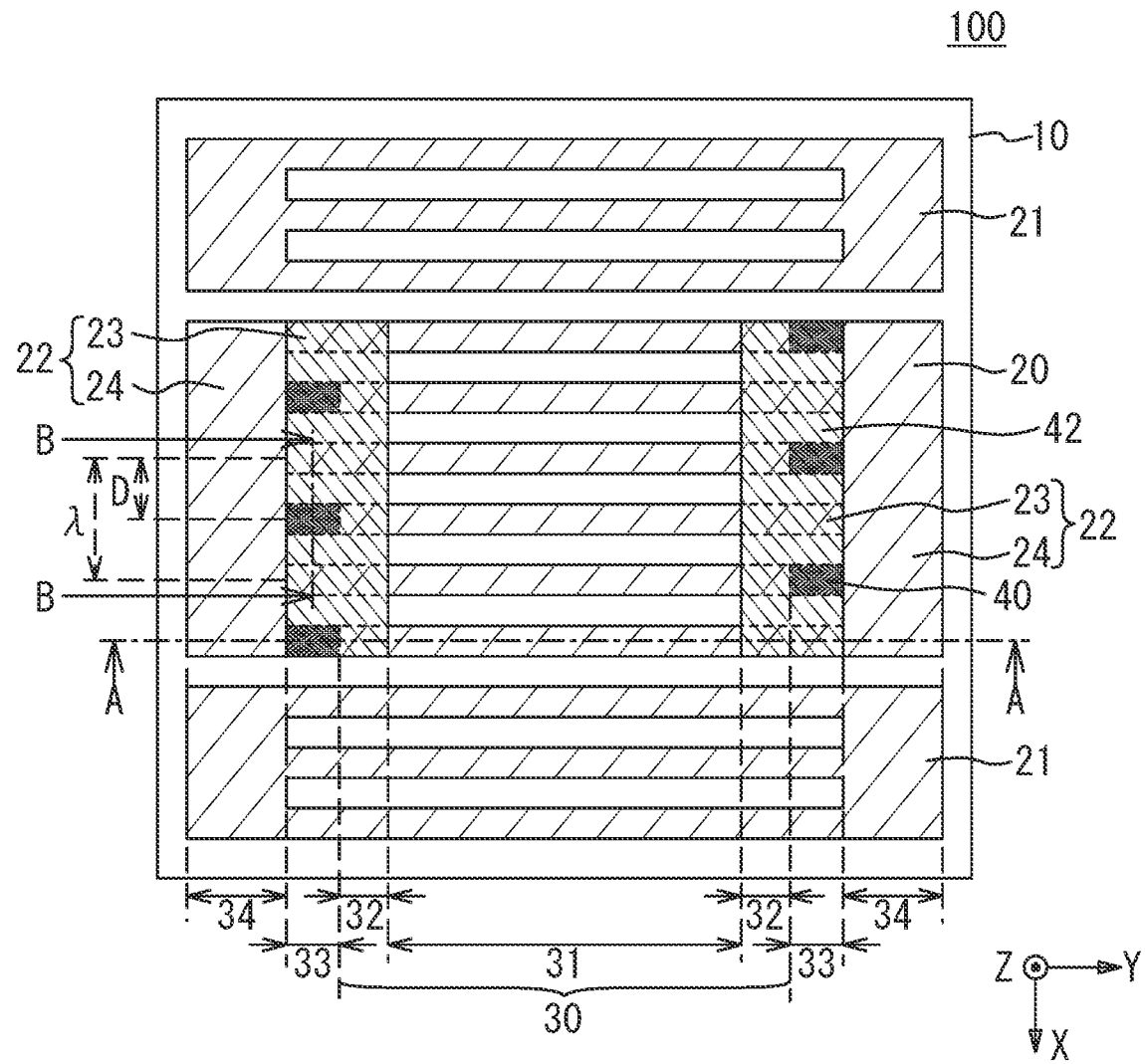
FIG. 1A is a plan view of an acoustic wave resonator in accordance with a first embodiment.
Figure 1B:
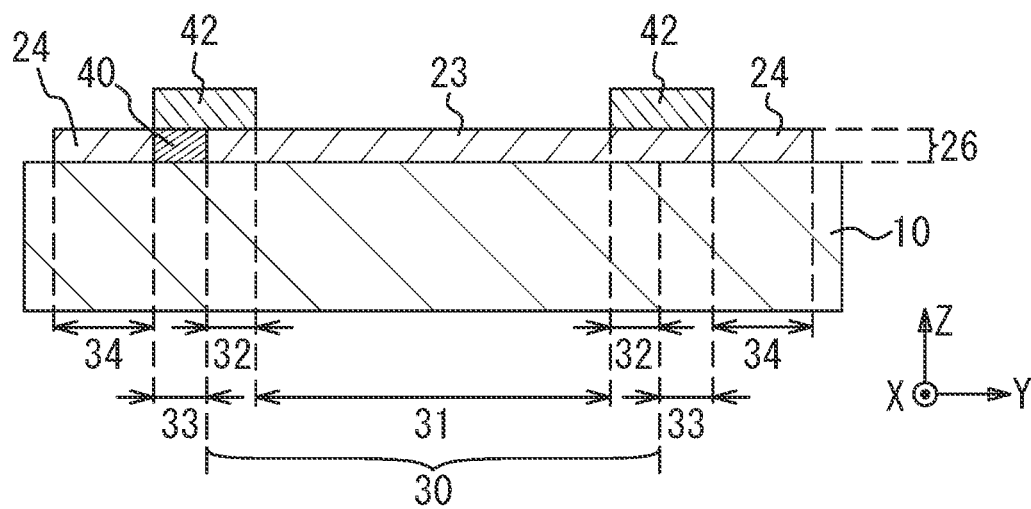
FIG. 1B is a cross-sectional view taken along line A-A in FIG. 1A.

FIG. 1A is a plan view of an acoustic wave resonator 100 in accordance with a first embodiment, and FIG. 1B is a cross-sectional view taken along line A-A in FIG. 1A. The direction in which electrode fingers are arranged (the arrangement direction of the electrode fingers) is defined as an X direction, the direction in which the electrode fingers extend (the extension direction of the electrode fingers) is defined as a Y direction, and the thickness direction of a piezoelectric substrate is defined as a Z direction. The X direction, the Y direction, and the Z direction do not necessarily correspond to the X-axis orientation and the Y-axis orientation of the crystal orientation of the piezoelectric substrate. In the case that the piezoelectric substrate is a rotated Y-cut X-propagation piezoelectric substrate, the X direction is the X-axis orientation of the crystal orientation.

As illustrated in FIG. 1A and FIG. 1B, in the acoustic wave resonator 100, an interdigital transducer (IDT) 20 and reflectors 21 are provided on a piezoelectric substrate 10. The reflectors 21 are provided so as to sandwich the IDT 20 therebetween in the X direction. The IDT 20 and the reflectors 21 are formed of a metal film 26 on the piezoelectric substrate 10.

The IDT 20 includes a pair of comb-shaped electrodes 22. Each of the comb-shaped electrodes 22 includes electrode fingers 23 and a bus bar 24 to which the electrode fingers 23 are coupled. The tips of the electrode fingers 23 of one of the comb-shaped electrodes 22 are opposite to the bus bar 24 of the other of the comb-shaped electrodes 22. The region where the electrode fingers 23 of one of the comb-shaped electrodes 22 and the electrode fingers 23 of the other of the comb-shaped electrodes 22 overlap is an overlap region 30. The length of the overlap region 30 in the Y direction is an aperture length. The comb-shaped electrodes 22 are opposite to each other so that the electrode fingers 23 of one of the comb-shaped electrodes 22 and the electrode fingers 23 of the other of the comb-shaped electrodes 22 are alternately arranged in at least a part of the overlap region 30. The acoustic wave (the surface acoustic wave) that is the primary mode, excited by the electrode fingers 23 in the overlap region 30, propagates mainly in the X direction. The pitch of the electrode fingers 23 of one of the comb-shaped electrodes 22 is equal to the wavelength k of the acoustic wave. The pitch D of the electrode fingers 23 is two times the pitch of the electrode fingers 23 of one of the comb-shaped electrodes 22. The reflectors 21 reflect the acoustic wave (the surface acoustic wave) excited by the electrode fingers 23 of the IDT 20. As a result, the acoustic wave is confined in the overlap region 30 of the IDT 20.

The overlap region 30 has edge regions 32 and a center region 31. Each of the edge regions 32 is the region located in the edge in the Y direction (the region where the tips of the electrode fingers 23 are located). The center region 31 is the region located further in than the edge regions 32 in the Y direction. The region located between the tips of the electrode fingers 23 of one of the comb-shaped electrodes 22 and the bus bar 24 of the other of the comb-shaped electrodes 22 is a gap region 33. In other words, the gap region is a first region, where no metal film electrically connected to the bus bar 24 of the other of the comb-shaped electrodes 22 is provide, of the region located between the tips of the electrode fingers 23 of one of the comb-shaped electrodes 22 and the bus bar 24 of the other of the comb-shaped electrodes 22. The region where the bus bar 24 is located is a bus bar region 34.

An additional film 40 is provided on the piezoelectric substrate 10 between each of the tips of the electrode fingers 23 of one of the comb-shaped electrodes 22 and the bus bar 24 of the other of the comb-shaped electrodes 22. No additional film 40 is provided on the adjacent electrode fingers 23 in the X direction and under the electrode fingers 23. The upper surface of the additional film 40 may be in the same plane as the upper surface of the electrode finger 23, or there may be a level difference between the upper surface of the additional film 40 and the upper surface of the electrode finger 23. The additional film 40 may be thicker or thinner than the electrode fingers 23. The width of the additional film 40 in the X direction may be the same as the width of the electrode finger 23 in the X direction, or may be greater or less than the width of the electrode finger 23 in the X direction. Although details will be described later, the additional film 40 is provided to adjust the acoustic velocity of the surface acoustic wave in the gap region 33.

Additional films 42 are provided over the piezoelectric substrate 10 so as to cover the electrode fingers 23 and the additional films 40 from the respective edge regions 32 to the respective gap regions 33. No additional film 42 is provided in the center region 31. As long as the additional film 42 is provided on the electrode fingers 23 and the additional film 40, no additional film 42 may be provided between the electrode fingers 23. The thickness of the additional film 42 on the electrode finger 23 is substantially the same as the thickness of the additional film 42 on the additional film 40. The term "substantially the same" here means that the difference in the degree of manufacturing error is acceptable. Although details will be described later, the additional films 42 are provided to adjust the acoustic velocities of the surface acoustic waves in the edge regions 32 and the gap regions 33.

The piezoelectric substrate 10 is, for example, a monocrystalline lithium tantalate ($LiTaO_3$) substrate or a monocrystalline lithium niobate ($LiNbO_3$) substrate, and is, for example, a rotated Y-cut X-propagation lithium tantalate substrate or a rotated Y-cut X-propagation lithium niobate substrate. The piezoelectric substrate 10 is, for example, a 36° to 48° Y-cut X-propagation lithium tantalate substrate.

The metal film 26 is a film mainly composed of, for example, aluminum (Al), copper (Cu), or molybdenum (Mo). An adhesion film such as a titanium (Ti) film or a chrome (Cr) film may be provided between the electrode fingers 23 and the piezoelectric substrate 10 and between the bus bars 24 and the piezoelectric substrate 10. The adhesion film is thinner than the electrode fingers 23 and the bus bars 24. An insulating film may be provided so as to cover the electrode fingers 23. In this case, the additional film 40 and the additional film 42 may be provided on the insulating film. The insulating film may serve as a passivation film.

The additional film 40 is a film mainly composed of, for example, silicon oxide ($SiO_2$), tantalum oxide ($Ta_2O_5$), niobium oxide ($Nb_2O_5$), aluminum (Al), or titanium (Ti), but may be a film mainly composed of other materials as long as it can adjust the acoustic velocity of the acoustic wave propagating through the gap region 33. In the case that the additional film 40 is a metal film such as aluminum or titanium, insulating films are provided between the additional films 40 and the electrode fingers 23 and between the additional films 40 and the bus bars 24, and this will be described later.

The additional film 42 is a film mainly composed of, for example, silicon oxide ($SiO_2$), tantalum oxide ($Ta_2O_5$), niobium oxide ($Nb_2O_5$), aluminum (Al), or titanium (Ti), but may be a film mainly composed of other materials as long as it can adjust the acoustic velocities of the acoustic waves propagating through the edge region 32 and the gap region 33. The additional film 42 may be a film mainly composed of the same material as the additional film 40, or may be a film mainly composed of a material different from the material of the additional film 40. In the case that the additional film 42 is a metal film such as aluminum or titanium, insulating films are provided between the additional films 42 and the electrode fingers 23 and between the additional films 42 and the bus bars 24, and this will be described later.

Figure 2A:
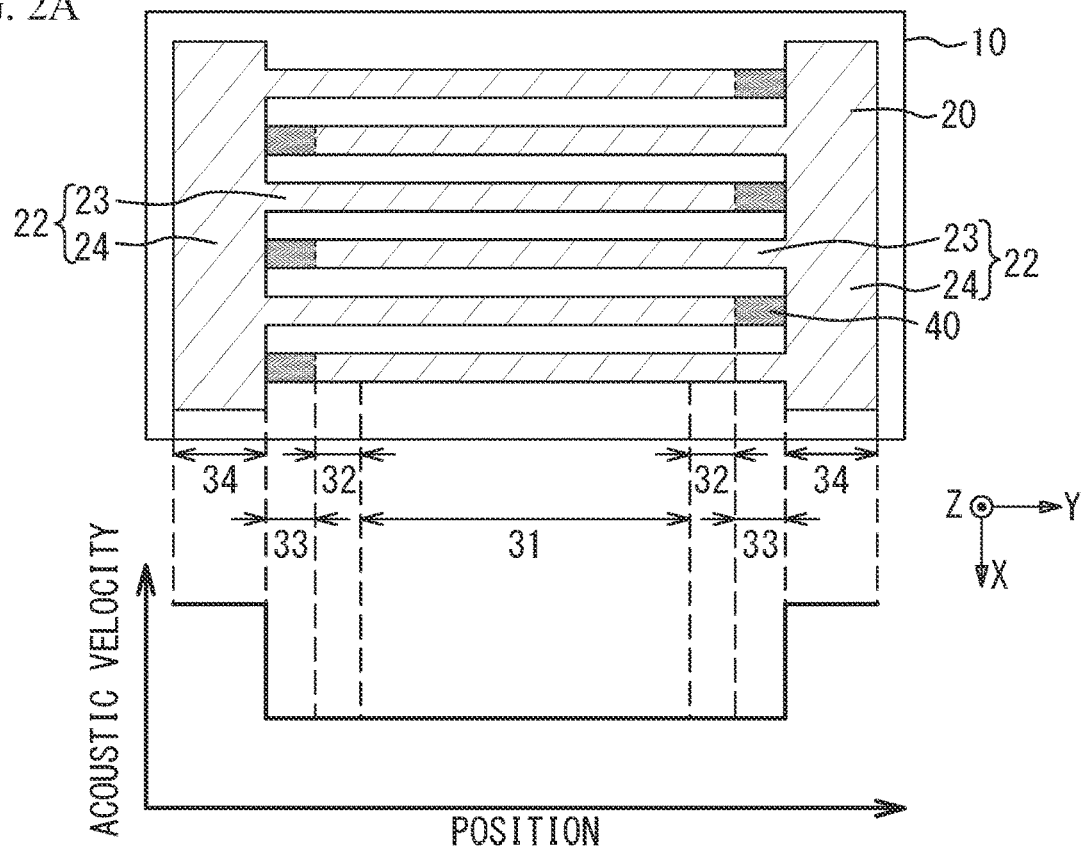
FIG. 2A and FIG. 2B illustrate the acoustic velocity of a surface acoustic wave in an interdigital transducer (IDT) in the first embodiment.
Figure 2B:
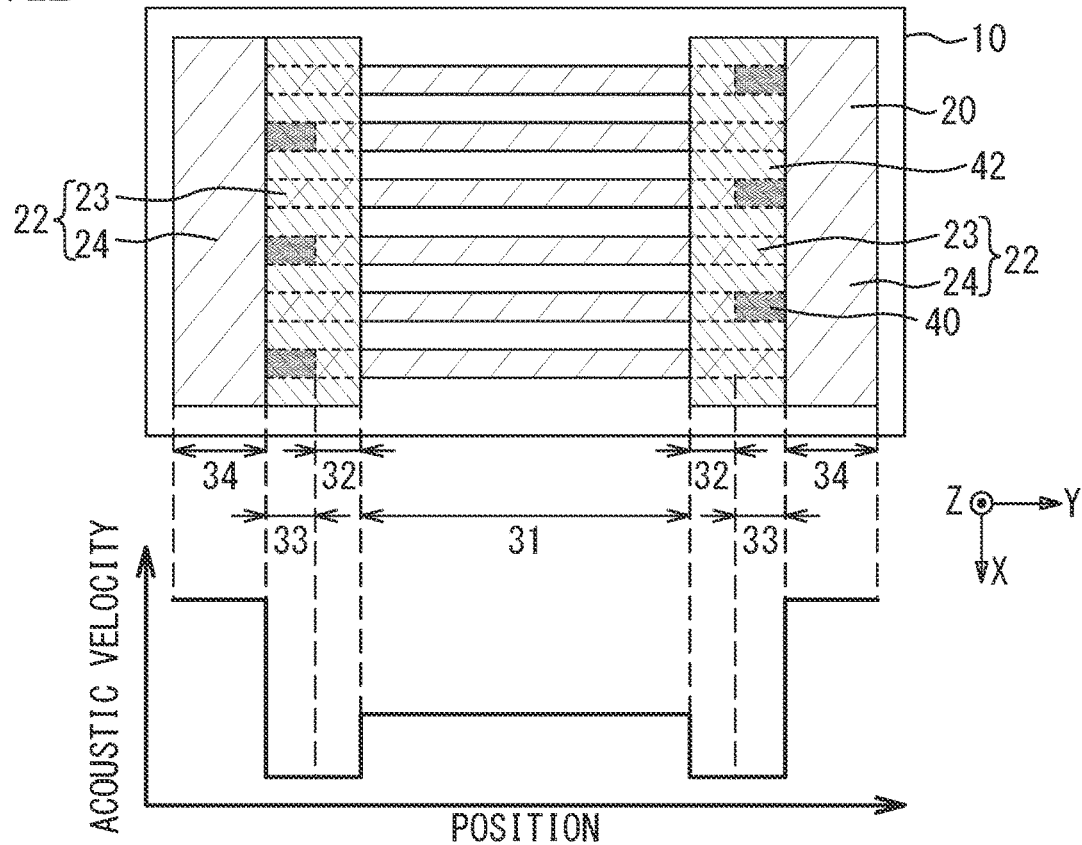

FIG. 2A and FIG. 2B illustrate the acoustic velocity of the acoustic wave in the IDT 20 in the first embodiment. FIG. 2A illustrates the state before the additional films 42 are provided, and FIG. 2B illustrates the state after the additional films 42 are provided. As illustrated in FIG. 2A, provision of the additional films 40 on the piezoelectric substrate 10 between the tips of the electrode fingers 23 and the bus bars 24 makes the acoustic velocities of the surface acoustic waves propagating through the center region 31, the edge regions 32, and the gap regions 33 substantially the same. In other words, provided are the additional films 40 of which the material, the thickness, and/or the width is adjusted so that the acoustic velocities of the surface acoustic waves propagating through the gap regions 33 is substantially the same as the acoustic velocities of the surface acoustic waves propagating through the center region 31 and the edge regions 32.

As illustrated in FIG. 2B, provision of the additional films 42 from the respective edge regions 32 to the respective gap regions 33 makes the acoustic velocities of the surface acoustic waves propagating through the edge regions 32 and the gap regions 33 lower than the acoustic velocity of the surface acoustic wave propagating through the center region 31. That is, provided is the additional films 42 of which the material, the thickness, and/or the width is adjusted so that the acoustic velocities of the surface acoustic waves propagating through the edge regions 32 and the gap regions 33 are appropriately lower than the acoustic velocity of the surface acoustic wave propagating through the center region 31. The acoustic velocity of the surface acoustic wave propagating through the center region 31 is greater than 1.02 times the acoustic velocity of the surface acoustic wave propagating through the edge region 32 and less than 1.035 times the acoustic velocity of the surface acoustic wave propagating through the edge region 32, for example.

Since the additional films 40 make the acoustic velocities of the surface acoustic waves propagating through the gap regions 33 substantially the same as the acoustic velocities of the surface acoustic waves propagating through the edge regions 32, even after the additional films 42 are provided, the acoustic velocities of the surface acoustic waves propagating through the gap regions 33 are substantially the same as the acoustic velocities of the surface acoustic waves propagating through the edge regions 32. The term "substantially the same" means that the acoustic velocities of the surface acoustic waves propagating through the gap regions 33 are equal to or greater than 0.98 times the acoustic velocities of the surface acoustic waves propagating through the edge regions 32 and equal to or less than 1.02 times the acoustic velocities of the surface acoustic waves propagating through the edge regions 32.

Manufacturing Method

Figure 3A:
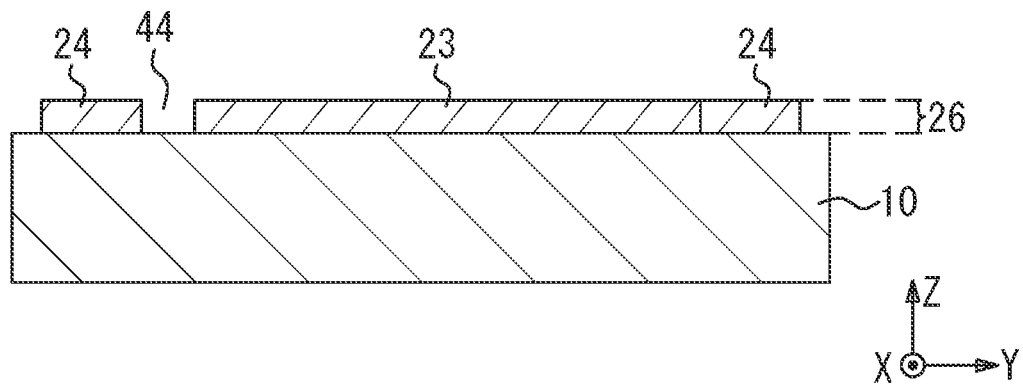
FIG. 3A to FIG. 3C are cross-sectional views illustrating a manufacturing method of the acoustic wave resonator in accordance with the first embodiment.
Figure 3B:
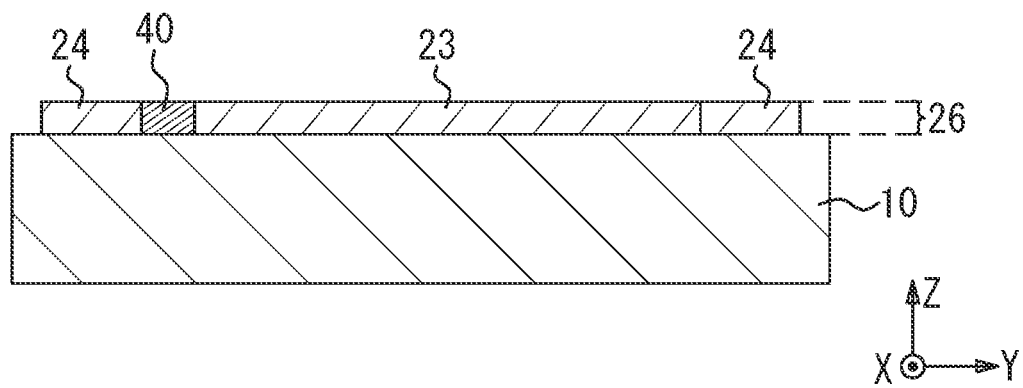
Figure 3C:
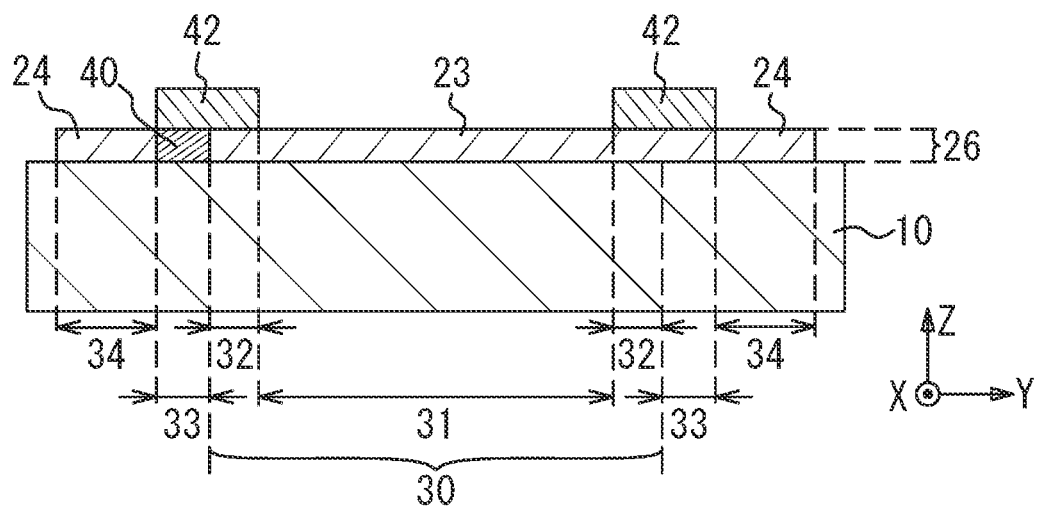

FIG. 3A to FIG. 3C are cross-sectional views illustrating a manufacturing method of the acoustic wave resonator 100 in accordance with the first embodiment. As illustrated in FIG. 3A, after the metal film 26 is formed on the piezoelectric substrate 10, the metal film 26 is patterned into a desired shape. This forms, on the piezoelectric substrate 10, the IDT 20, which includes a pair of the comb-shaped electrodes 22 each including the electrode fingers 23 and the bus bar 24, and the reflectors 21. Air gaps 44 are formed between the tips of the electrode fingers 23 of one of the comb-shaped electrodes and the bus bar 24 of the other of the comb-shaped electrodes. The metal film 26 is formed by, for example, sputtering, vacuum evaporation, or chemical vapor deposition (CVD). The metal film 26 is patterned by, for example, photolithography and etching.

As illustrated in FIG. 3B, the additional films 40 are formed in the air gaps 44 between the tips of the electrode fingers 23 and the bus bars 24. The additional films 40 are formed as follows, for example. A mask layer having openings corresponding to the air gaps 44 is formed on the piezoelectric substrate 10. Then, the additional films 40 are formed using the mask layer as a mask, and thereafter, the mask layer is removed. Through this process, the additional films 40 are formed. The mask layer is, for example, photoresist. The additional films 40 are formed by, for example, sputtering, vacuum evaporation, or CVD.

As illustrated in FIG. 3C, the additional films 42 are formed from the respective edge regions 32 to the respective gap regions 33 so as to cover the electrode fingers 23 and the additional films 40. The additional films 42 are formed as follows, for example. A mask layer having openings corresponding to the edge regions 32 and the gap regions 33 is formed over the piezoelectric substrate 10. Then, the additional films 42 are formed using the mask layer as a mask, and thereafter, the mask layer is removed. Through this process, the additional films 42 are formed. The mask layer is, for example, photoresist. The additional film 42 is formed by, for example, sputtering, vacuum evaporation, or CVD. This completes the acoustic wave resonator 100 in accordance with the first embodiment.

COMPARATIVE EXAMPLES

Figure 4:
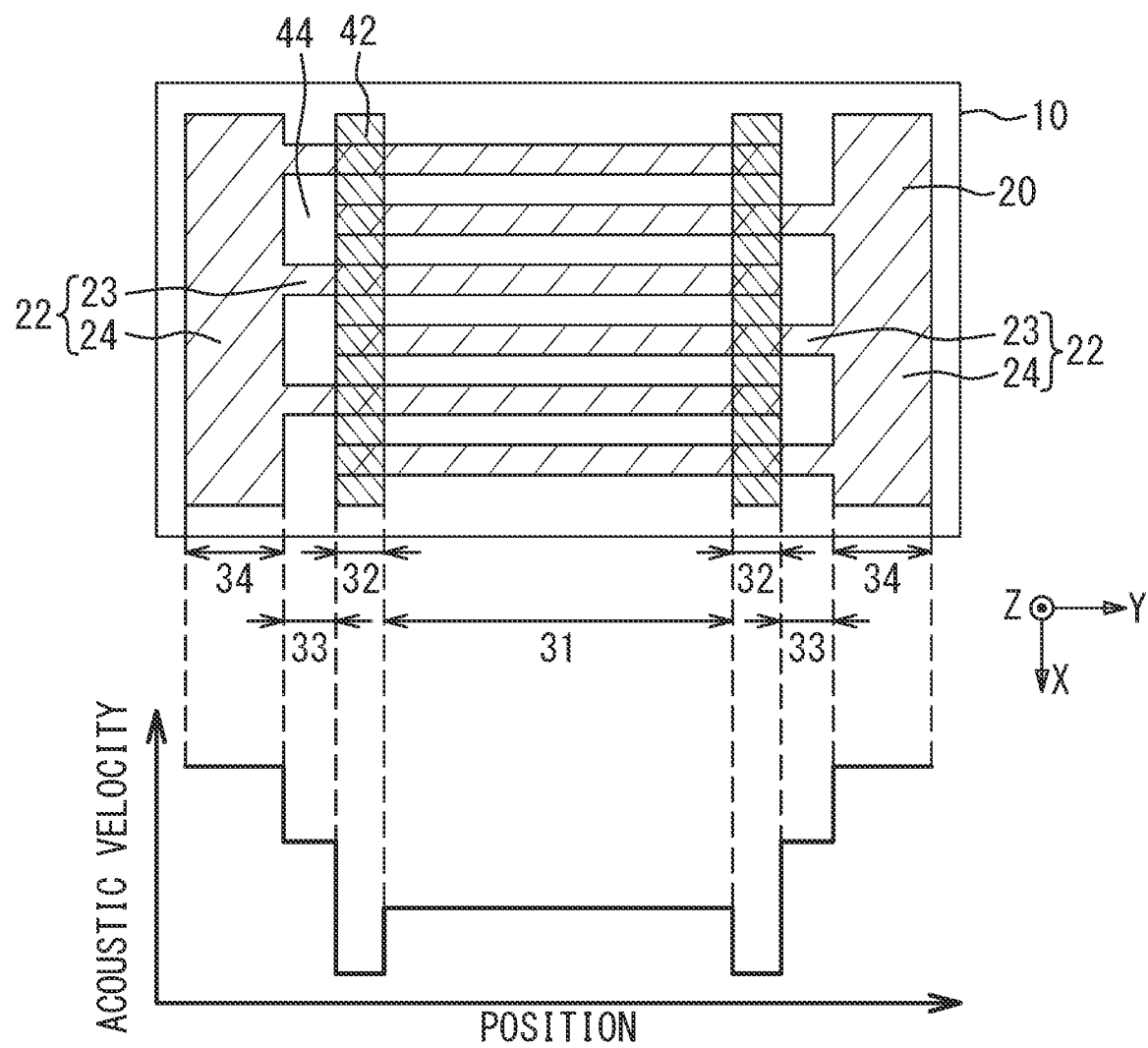
FIG. 4 illustrates the acoustic velocity of the acoustic wave in the IDT in a first comparative example.

FIG. 4 illustrates the acoustic velocity of the acoustic wave in the IDT 20 in a first comparative example. As illustrated in the upper part of FIG. 4, in the first comparative example, no additional film is provided between the tips of the electrode fingers 23 and the bus bars 24, and the air gaps 44 are formed between the tips of the electrode fingers 23 and the bus bars 24. The additional films 42 are provided only in the respective edge regions 32, and no additional film 42 is provided in the gap regions 33.

Since no additional film is provided between the tips of the electrode fingers 23 and the bus bars 24, and the additional films 42 are provided only in the respective edge regions 32, as illustrated in the lower part of FIG. 4, the acoustic velocities of the surface acoustic waves propagating through the edge regions 32 are lower than the acoustic velocities of the surface acoustic waves propagating through the center region 31, and the acoustic velocities of the surface acoustic waves propagating through the gap regions 33 are higher than the acoustic velocities of the surface acoustic waves propagating through the center region 31.

Figure 5:
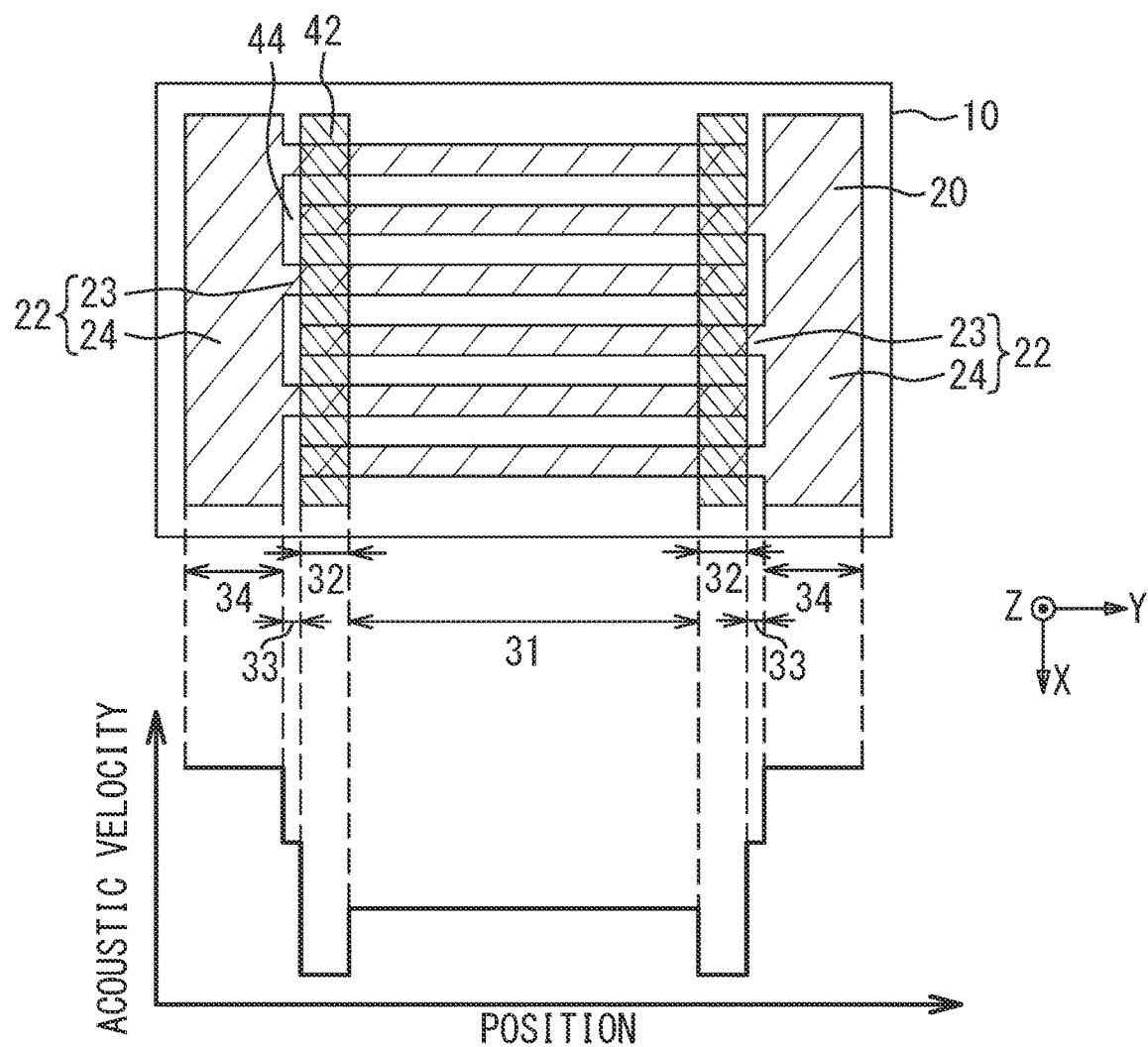
FIG. 5 illustrates the acoustic velocity of the acoustic wave in the IDT in a second comparative example.

FIG. 5 illustrates the acoustic velocity of the acoustic wave in the IDT 20 in a second comparative example. As illustrated in the upper and lower parts of FIG. 5, in the second comparative example, the distance between each of the tips of the electrode fingers 23 and the bus bar 24 is narrow. That is, the length of the gap region 33 in the Y direction is short. The length of the gap region 33 in the Y direction is, for example, 1λ or less. Other structures are the same as those of the first comparative example.

In the first comparative example, the length of the gap region 33 in the Y direction is long. In this case, the edge region 32 acts as the low acoustic velocity region of the piston mode, and the gap region 33 acts as the high acoustic velocity region of the piston mode. In the second comparative example, to miniaturize the acoustic wave resonator and/or reduce the diffraction loss, the length of the gap region 33 in the Y direction is small. In this case, the edge region 32 may act as the low acoustic velocity region of the piston mode, and the bus bar region 34 may act as the high acoustic velocity region of the piston mode.

As described above, depending on the length of the gap region 33 in the Y direction, the gap region 33 may act as the high acoustic velocity region, or the bus bar region 34 may act as the high acoustic velocity region. Therefore, to achieve the piston-mode excitation, according to the length of the gap region 33 in the Y direction, the acoustic velocities of the surface acoustic waves propagating through the gap regions 33 and/or the acoustic velocities of the surface acoustic waves propagating through the bus bar regions 34 are adjusted. Thus, the adjustments to achieve the piston-mode excitation become complicated.

Figure 6:
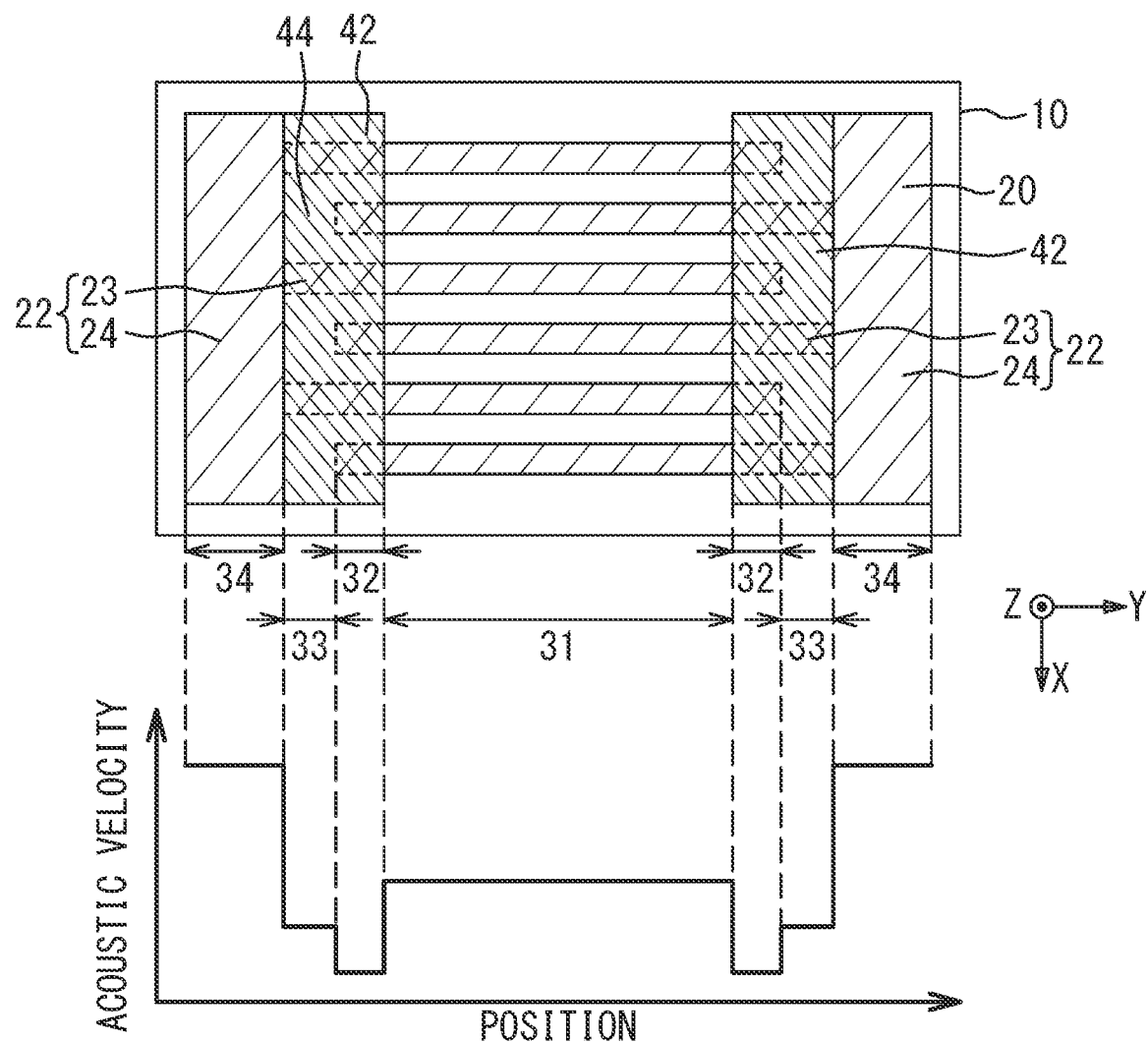
FIG. 6 illustrates the acoustic velocity of the acoustic wave in the IDT in a third comparative example.

FIG. 6 illustrates the acoustic velocity of the acoustic wave in the IDT 20 in a third comparative example. As illustrated in the upper part of FIG. 6, in the third comparative example, the additional films 42 are provided from the respective edge regions 32 to the respective gap regions 33. Other structures are the same as those of the first comparative example. As illustrated in the lower part of FIG. 6, since the additional films 42 are provided from the respective edge regions 32 to the respective gap regions 33, the acoustic velocities of the surface acoustic waves propagating through the gap regions 33 are lower than those in the first comparative example.

The lower part of FIG. 6 illustrates a case in which the acoustic velocities of the surface acoustic waves propagating through the gap regions 33 are lower than the acoustic velocity of the surface acoustic wave propagating through the center region 31, but depending on the degree of the mass load effect of the additional film 42 (the acoustic velocity reduction effect due to the mass load on the piezoelectric substrate 10), the acoustic velocities of the surface acoustic waves propagating through the gap regions 33 may be higher than the acoustic velocity of the surface acoustic wave propagating through the center region 31. In the case that the acoustic velocities of the surface acoustic waves propagating through the gap regions 33 are lower than the acoustic velocity of the surface acoustic wave propagating through the center region 31, the bus bar regions 34 act as the high acoustic velocity regions. In the case that the acoustic velocities of the surface acoustic waves propagating through the gap regions 33 are higher than the acoustic velocity of the surface acoustic wave propagating through the center region 31, the gap regions 33 act as the high acoustic velocity regions. As described above, to achieve the piston-mode excitation, according to the mass load effect of the additional film 42, the acoustic velocities of the surface acoustic waves propagating through the gap regions 33 and/or the acoustic velocities of the surface acoustic waves propagating through the bus bar regions 34 are adjusted. Therefore, the adjustments to achieve the piston-mode excitation become complicated.

By contrast, in the first embodiment, as illustrated in FIG. 2B, the acoustic velocities of the acoustic waves propagating through the gap regions 33 are equal to or greater than 0.98 times the acoustic velocities of the acoustic waves propagating through the edge regions 32 and equal to or less than 1.02 times the acoustic velocities of the acoustic waves propagating through the edge regions 32. The additional films 42 are provided from the respective edge regions 32 to the respective gap regions 33, and no additional film 42 is provided in the center region 31. In this structure, independently from the length of the gap region 33 in the Y direction and the degree of the mass load effect of the additional film 42, the edge regions 32 and the gap regions 33 act as the low acoustic velocity regions, and the bus bar regions 34 act as the high acoustic velocity regions. Therefore, the complexity of the adjustments to achieve the piston-mode excitation is reduced, and the piston-mode excitation can be easily achieved. For example, the conditions required to achieve the piston-mode excitation include the length of the low acoustic velocity region in the Y direction and the acoustic velocity of the acoustic wave propagating through the low acoustic velocity region. These conditions can be adjusted by the length of the additional film 42 in the Y direction and the thickness of the additional film 42. The acoustic velocities of the acoustic waves propagating through the gap regions 33 are preferably equal to or greater than 0.985 times the acoustic velocities of the acoustic waves propagating through the edge regions 32 and equal to or less than 1.015 times the acoustic velocities of the acoustic waves propagating through the edge regions 32, more preferably equal to or greater than 0.99 times the acoustic velocities of the acoustic waves propagating through the edge regions 32 and equal to or less than 1.01 times the acoustic velocities of the acoustic waves propagating through the edge regions 32, further preferably equal to or greater than 0.995 times the acoustic velocities of the acoustic waves propagating through the edge regions 32 and equal to or less than 1.005 times the acoustic velocities of the acoustic waves propagating through the edge regions 32.

To achieve the piston mode, the length of the center region 31 in the Y direction and the length of the edge region 32 in the Y direction satisfy a certain consistent relationship. For example, the length of the center region 31 in the Y direction is preferably greater than the sum of the lengths of the edge regions 32 in the Y direction. The sum of the lengths of the edge regions 32 in the Y direction is preferably 5λ or less (for example, equal to or less than ¼ of the aperture length), more preferably 2λ or less (for example, equal to or less than ¹⁄₁₀ of the aperture length). The length of each of the edge regions 32 in the Y direction is preferably 0.1λ or greater (for example, equal to or greater than ¹⁄₂₀₀ of the aperture length), more preferably 0.5λ or greater (for example, equal to or greater than ¹⁄₄₀ of the aperture length). The edge region 32 may be provided at only one side of the center region 31. The sum of the lengths of the gap regions 33 in the Y direction is preferably 5λ or less (for example, equal to or less than ¼ of the aperture length), more preferably 2λ or less (for example, equal to or less than ¹⁄₁₀ of the aperture length). The length of each of the gap regions 33 in the Y direction is preferably 0.1% or greater (for example, equal to or greater than ¹⁄₂₀₀ of the aperture length), more preferably 0.5λ or greater (for example, equal to or greater than ¹⁄₄₀ of the aperture length).

In addition, in the first embodiment, as illustrated in FIG. 1A and FIG. 1B, the additional films 40 are provided on the piezoelectric substrate 10 between the tips of the electrode fingers 23 and the bus bars 24. This structure makes the acoustic velocities of the acoustic waves propagating through the gap regions 33 lower and thereby allows the acoustic velocities of the acoustic waves propagating through the gap regions 33 to be substantially the same as the acoustic velocities of the acoustic waves propagating through the edge regions 32.

Additionally, in the first embodiment, the additional film 40 is a film mainly composed of silicon oxide, tantalum oxide, niobium oxide, aluminum, or titanium. Provision of such additional films 40 on the piezoelectric substrate 10 between the tips of the electrode fingers 23 and the bus bars 24 allows the acoustic velocities of the acoustic waves propagating through the gap regions 33 to be substantially the same as the acoustic velocities of the acoustic waves propagating through the edge regions 32. The term "mainly composed of" means that in the case that the additional film 40 is mainly composed of a compound such as silicon oxide, tantalum oxide, or niobium oxide, the sum of the ratios of the elements constituting the compound to the sum of the elements contained in the additional film 40 is 50 at % (atomic %) or greater, and may be 80 at % or greater. The ratio of each of the elements constituting the compound is 10 at % or greater, and may be 20 at % or greater. In the case that the additional film 40 is mainly composed of a single substance such as aluminum or titanium, the ratio of the element of the single substance to the sum of the elements contained in the additional film 40 is 50 at % or greater, and may be 80 at % or greater.

In the first embodiment, the acoustic velocities of the acoustic waves propagating through the gap regions 33 are preferably equal to or greater than 0.98 times the acoustic velocities of the acoustic waves propagating through the edge regions 32 and equal to or less than 1.00 time the acoustic velocities of the acoustic waves propagating through the edge regions 32. This structure allows the gap regions 33 and the edge regions 32 to act as the low acoustic velocity regions more reliably. The acoustic velocities of the acoustic waves propagating through the gap regions 33 are equal to or greater than 0.985 times the acoustic velocities of the acoustic waves propagating through the edge regions 32 and equal to or less than 1.00 time the acoustic velocities of the acoustic waves propagating through the edge regions 32, more preferably equal to or greater than 0.99 times the acoustic velocities of the acoustic waves propagating through the edge regions 32 and equal to or less than 1.00 time the acoustic velocities of the acoustic waves propagating through the edge regions 32, and further preferably equal to or greater than 0.995 times the acoustic velocities of the acoustic waves propagating through the edge regions 32 and equal to or less than 1.00 time the acoustic velocities of the acoustic waves propagating through the edge regions 32.

Figure 7:
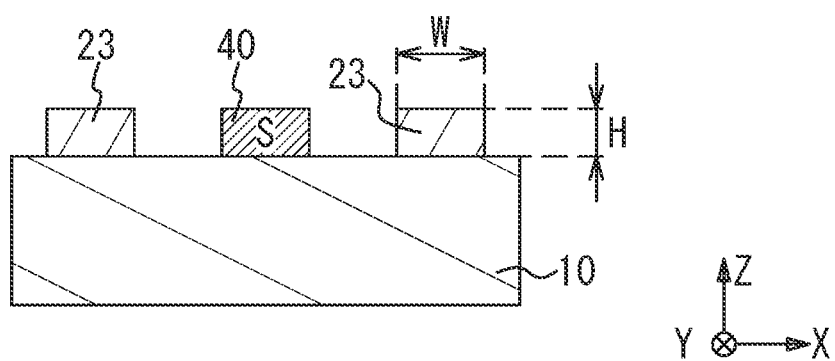
FIG. 7 is a cross-sectional view taken along line B-B in FIG. 1A.

FIG. 7 is across-sectional view taken along line B-B in FIG. 1A. In FIG. 7, for clarity of the drawing, the additional film 42 is not illustrated. As illustrated in FIG. 7, the width of the electrode finger 23 in the X direction is represented by W, and the thickness of the electrode finger 23 is represented by H. The area of the cross-section parallel to the X direction of the additional film 40 is represented by S. In the case that the comb-shaped electrodes 22 are formed to be mainly composed of aluminum and the additional films 40 are formed to be mainly composed of silicon oxide, the cross-section area S preferably satisfies $1.14 \times H \times W \leq S \leq 1.31 \times H \times W$. The following describes this reason.

In terms of the mass load effect to reduce the acoustic velocity of the acoustic wave by the mass load on the piezoelectric substance, the silicon oxide film is approximately 87.5% when the aluminum film is 1. Therefore, in the case that the silicon oxide film and the aluminum film have the same width, the film thickness required for the silicon oxide film to obtain the same mass load effect as the aluminum film is approximately 1.14 times the thickness of the aluminum film. For example, in the case that the silicon oxide film and the aluminum film have the same width, to obtain the same mass load effect as the aluminum film with a film thickness of 0.1λ, the film thickness of the silicon oxide film is 0.1λ×1.14=0.114λ. Therefore, when the width of the electrode finger 23 mainly composed of aluminum is represented by W, the thickness of the electrode finger 23 is represented by H, and the cross-section area of the additional film 40 mainly composed of silicon oxide is represented by S, the mass load effect of the electrode fingers 23 and the mass load effect of the additional films 40 become the same by satisfying S=1.14×H×W. Therefore, the acoustic velocities of the acoustic waves propagating through the gap regions 33 can be made to be the same as the acoustic velocities of the acoustic waves propagating through the edge regions 32.

To reduce the acoustic velocity of the acoustic wave by 2% using the mass load effect, the thickness is required to be equal to or greater than approximately 1.15 times the original film thickness. For example, assumed is a case in which the silicon oxide film and the aluminum film have the same width, and the film thickness of the silicon oxide film is adjusted to be $0.114\lambda$ to obtain the same mass load effect as the aluminum film with a film thickness of $0.1\lambda$. In this case, to reduce the acoustic velocity of the acoustic wave by 2% by increasing the mass load effect of the silicon oxide film, the film thickness of the silicon oxide film is required to be $0.114\lambda \times 1.15 = 0.131\lambda$. Therefore, when the width of the electrode finger 23 mainly composed of aluminum is represented by W, the thickness of the electrode finger 23 is represented by H, and the cross-section area of the additional film 40 mainly composed of silicon oxide is represented by S, the acoustic velocities of the acoustic waves propagating through the gap regions 33 where the additional films 40 are provided become lower than the acoustic velocity of the acoustic wave propagating through the overlap region 30, where the electrode fingers 23 overlap, by 2% by satisfying $S = 1.31 \times H \times W$.

Thus, by satisfying $1.14 \times H \times W \leq S \leq 1.31 \times H \times W$, the acoustic velocities of the acoustic waves propagating through the gap regions 33 can be made to be equal to or greater than 0.98 times the acoustic velocities of the acoustic waves propagating through the edge regions 32 and equal to or less than 1.00 time the acoustic velocities of the acoustic waves propagating through the edge regions 32.

In the first embodiment, the length of the gap region 33 in the Y direction may be equal to or less than two times the average pitch D of the electrode fingers 23 (equal to or less than $1\lambda$). In this case, as in the second comparative example, the acoustic wave resonator can be miniaturized and/or the diffraction loss can be reduced. In the second comparative example, in the case that the length of the gap region 33 in the Y direction is $1\lambda$ or less, the high acoustic velocity regions may be the gap regions 33 or the bus bar regions 34. By contrast, in the first embodiment, the low acoustic velocity regions are the edge regions 32 and the gap regions 33, and the high acoustic velocity regions are the bus bar regions 34. To miniaturize the acoustic wave resonator and/or reduce the diffraction loss, the length of the gap region 33 in the Y direction may be equal to or less than 1.5 times the average pitch D of the electrode fingers 23 (equal to or less than $0.75\lambda$), or may be equal to or less than 1 time the average pitch D of the electrode fingers 23 (equal to or less than $0.5\lambda$). The average pitch D of the electrode fingers 23 is calculated by dividing the width of the IDT 20 in the X direction by the number of the electrode fingers 23.

Variations

Figure 8A:
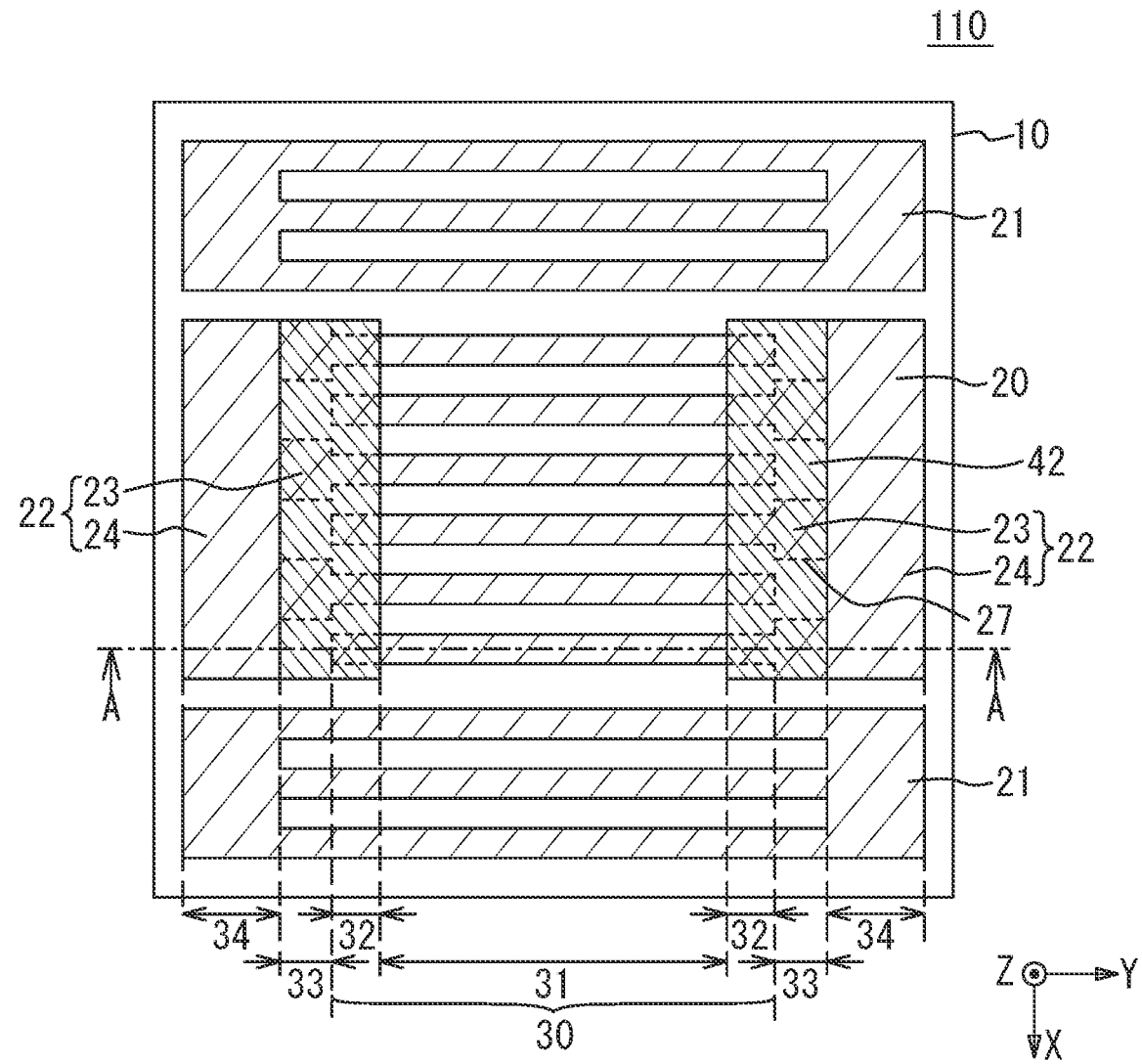
FIG. 8A is a plan view of an acoustic wave resonator in accordance with a first variation of the first embodiment.
Figure 8B:
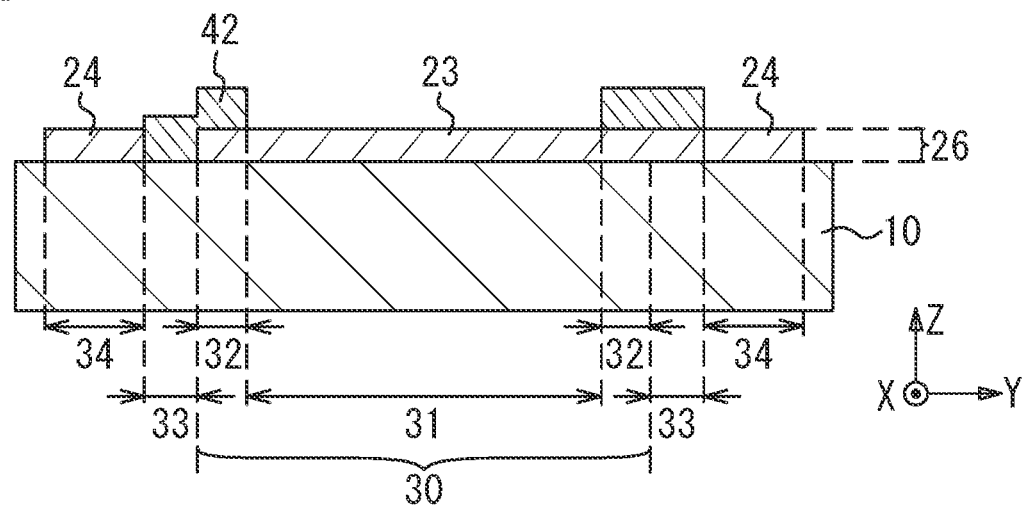
FIG. 8B is a cross-sectional view taken along line A-A in FIG. 8A.

FIG. 8A is a plan view of an acoustic wave resonator 110 in accordance with a first variation of the first embodiment, and FIG. 8B is a cross-sectional view taken along line A-A in FIG. 8A. As illustrated in FIG. 8A and FIG. 8B, in the acoustic wave resonator 110, no additional film 40 is provided between the tips of the electrode fingers 23 and the bus bars 24, and the additional films 42 provided from the respective edge regions 32 to the respective gap regions 33 are provided between the tips of the electrode fingers 23 and the bus bars 24. The thickness of the additional film 42 between the tip of the electrode finger 23 and the bus bar 24 is substantially the same as the thickness of the additional film 42 on the electrode finger 23. The term "substantially the same" here means that the difference in the degree of manufacturing error is acceptable. The width of the electrode finger 23 in the gap region 33 (the length in the X direction) is larger than the width of the electrode finger 23 in the overlap region 30 (the length in the X direction). That is, the electrode finger 23 has a broad part 27, of which the width is greater than the width of the electrode finger 23 in the overlap region 30, in the gap region 33. For example, the width of the electrode finger 23 in the gap region 33 (the width of the broad part 27) may be equal to or greater than 1.2 times the width of the electrode finger 23 in the overlap region 30 and equal to or less than 2.0 times the width of the electrode finger 23 in the overlap region 30, may be equal to or greater than 1.3 times the width of the electrode finger 23 in the overlap region 30 and equal to or less than 1.8 times the width of the electrode finger 23 in the overlap region 30, or may be equal to or greater than 1.4 times the width of the electrode finger 23 in the overlap region 30 and equal to or less than 1.6 times the width of the electrode finger 23 in the overlap region 30. Other structures are the same as those of the first embodiment, and the description thereof is thus omitted.

Figure 9A:
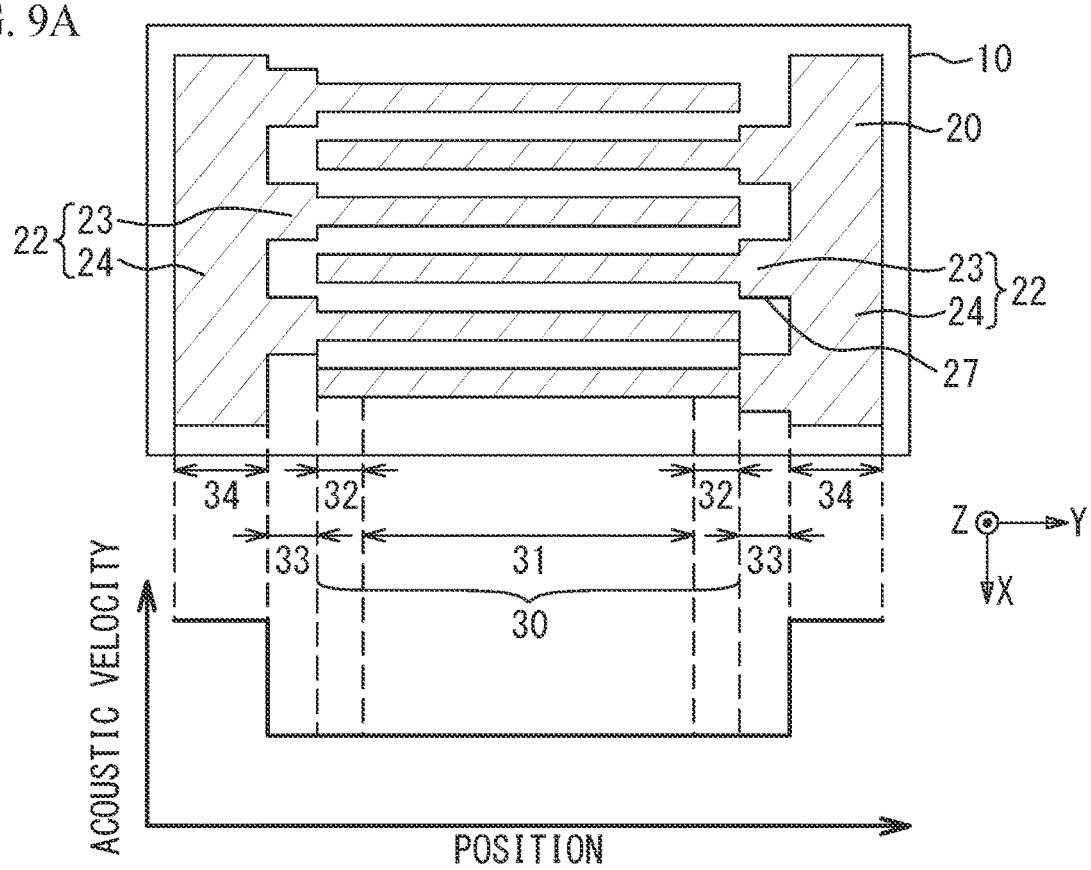
FIG. 9A and FIG. 9B illustrate the acoustic velocity of the acoustic wave in the IDT in the first variation of the first embodiment.
Figure 9B:
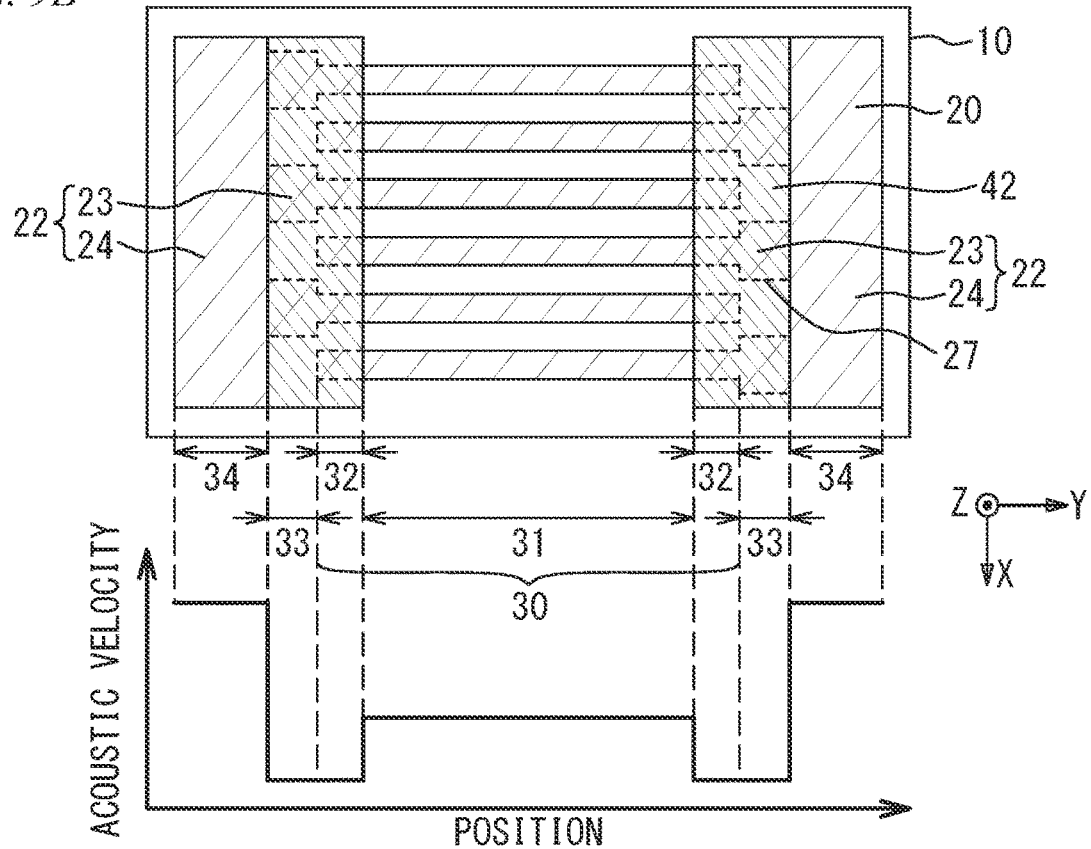

FIG. 9A and FIG. 9B illustrate the acoustic velocity of the acoustic wave in the IDT 20 in the first variation of the first embodiment. FIG. 9A illustrates the state before the additional films 42 are provided, and FIG. 9B illustrates the state after the additional films 42 are provided. As illustrated in FIG. 9A, since the width of the electrode finger 23 in the gap region 33 is greater than the width of the electrode finger 23 in the overlap region 30, the acoustic velocities of the surface acoustic waves propagating through the center region 31, the edge regions 32, and the gap regions 33 are substantially the same. In other words, the width of each of the electrode fingers 23 in the gap regions 33 is adjusted so that the acoustic velocities of the surface acoustic waves propagating through the gap regions 33 are substantially the same as the acoustic velocities of the surface acoustic waves propagating through the center region 31 and the edge regions 32.

As illustrated in FIG. 9B, since the additional films 42 are provided from the respective edge regions 32 to the respective gap regions 33, the acoustic velocities of the surface acoustic waves propagating through the edge regions 32 and the gap regions 33 are lower than the acoustic velocity of the surface acoustic wave propagating through the center region 31. That is, provided are the additional films 42 of which the material, the thickness, and/or the width is adjusted so that the acoustic velocities of the surface acoustic waves propagating through the edge regions 32 and the gap regions 33 are appropriately lower than the acoustic velocity of the surface acoustic wave propagating through the center region 31.

Since the width of the electrode finger 23 in the gap region 33 is large, the acoustic velocities of the surface acoustic waves propagating through the gap regions 33 are substantially the same as the acoustic velocities of the surface acoustic waves propagating through the edge regions 32. Therefore, even after the additional films 42 are provided, the acoustic velocities of the surface acoustic waves propagating through the gap regions 33 and the acoustic velocities of the surface acoustic waves propagating through the edge regions 32 are substantially the same. The term "substantially the same" means that the acoustic velocities of the surface acoustic waves propagating through the gap regions 33 are equal to or greater than 0.98 times the acoustic velocities of the surface acoustic waves propagating through the edge regions 32 and equal to or less than 1.02 times the acoustic velocities of the surface acoustic waves propagating through the edge regions 32 as described above.

In the first embodiment, the acoustic velocities of the acoustic waves propagating through the gap regions 33 are adjusted to be the same as the acoustic velocities of the acoustic waves propagating through the edge regions 32 by providing the additional films 40 between the tips of the electrode fingers 23 and the bus bars 24. However, this does not intend to suggest any limitation. As in the first variation of the first embodiment, the acoustic velocities of the acoustic waves propagating through the gap regions 33 may be adjusted to be substantially the same as the acoustic velocities of the acoustic waves propagating through the edge regions 32 by widening the widths of the electrode fingers 23 in the gap regions 33. Alternatively, the acoustic velocities of the acoustic waves propagating through the gap regions 33 may be adjusted to be the same as the acoustic velocities of the acoustic waves propagating through the edge regions 32 using other methods. Alternatively, the acoustic velocities of the acoustic waves propagating through the gap regions 33 may be adjusted to be the same as the acoustic velocities of the acoustic waves propagating through the edge regions 32 by providing the additional films 40 and widening the widths of the electrode fingers 23 in the gap regions 33.

Figure 10A:
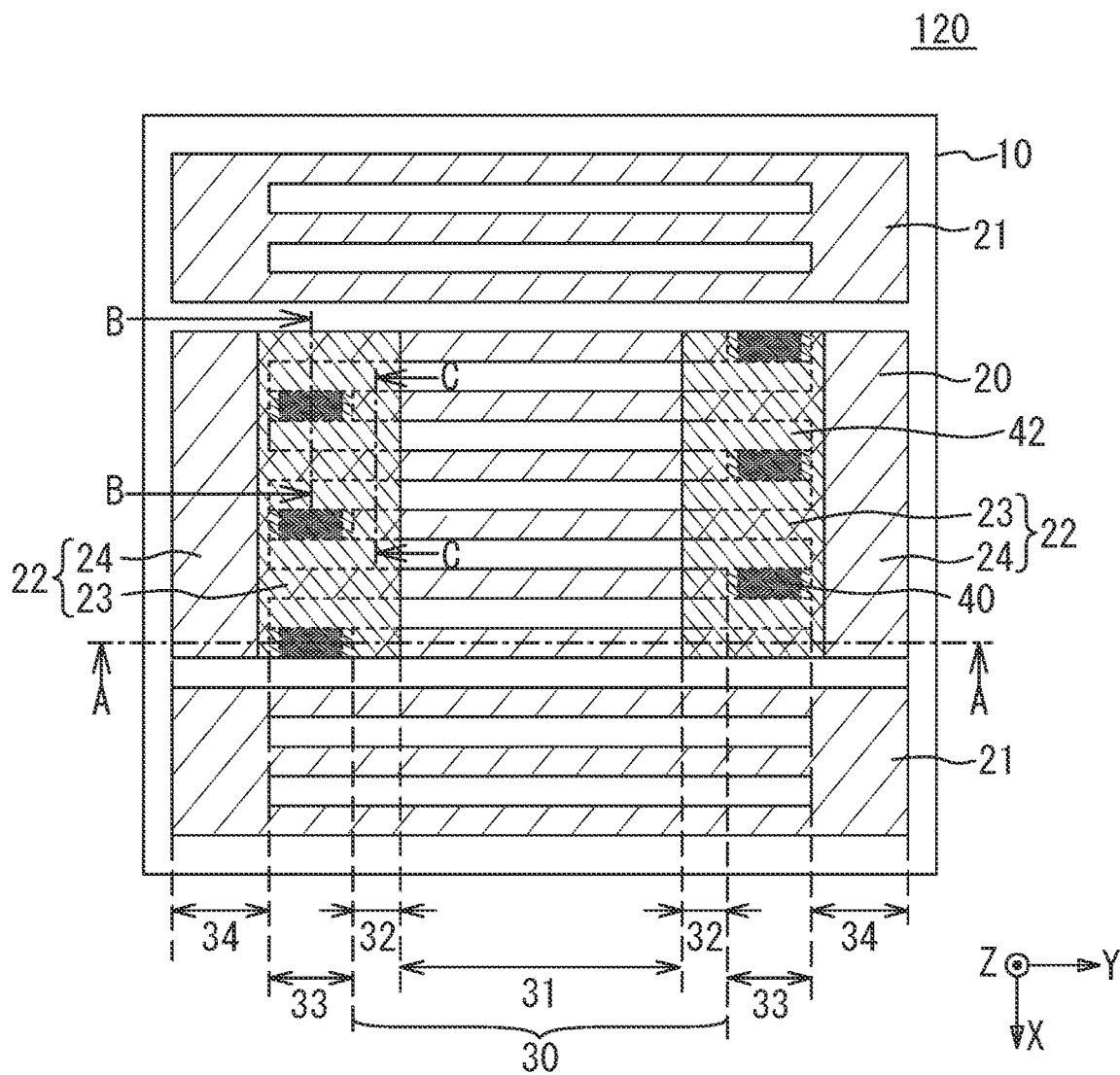
FIG. 10A is a plan view of an acoustic wave resonator in accordance with a second variation of the first embodiment.
Figure 10B:
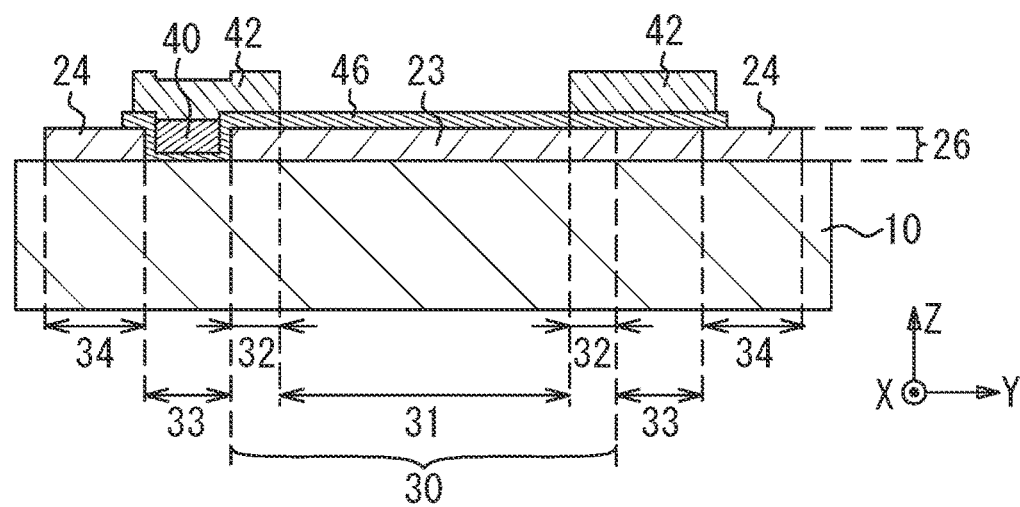
FIG. 10B is a cross-sectional view taken along line A-A in FIG. 10A.
Figure 11A:
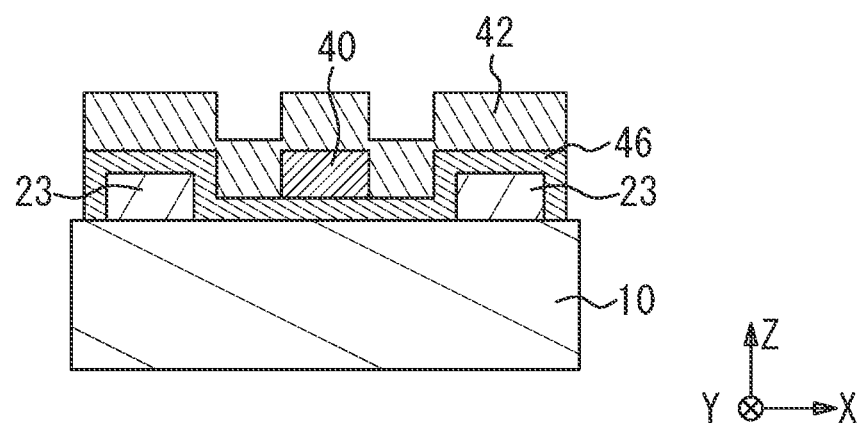
FIG. 11A is a cross-sectional view taken along line B-B in FIG. 10A.
Figure 11B:
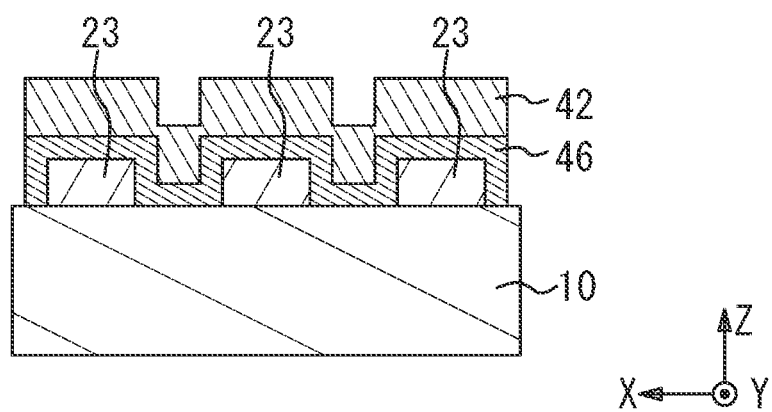
FIG. 11B is a cross-sectional view taken along line C-C in FIG. 10A.

FIG. 10A is a plan view of an acoustic wave resonator 120 in accordance with a second variation of the first embodiment, and FIG. 10B is a cross-sectional view taken along line A-A in FIG. 10A. FIG. 11A is a cross-sectional view taken along line B-B in FIG. 10A, and FIG. 11B is a cross-sectional view taken along line C-C in FIG. 10A. In FIG. 10A, a part of the insulating film 46 is not illustrated for clarity of the drawing. As illustrated in FIG. 10A, FIG. 10B, FIG. 11A, and FIG. 11B, in the acoustic wave resonator 120, the insulating films 46 are provided on the surfaces of the electrode fingers 23 and the bus bars 24, and the additional films 40 and the additional films 42 are provided on the insulating film 46. Therefore, in the Y direction, the insulating film 46 is provided between the additional films 40 and the electrode fingers 23 and between the additional films 40 and the bus bar 24, and the additional films 40 are in direct contact with neither the electrode fingers 23 nor the bus bar 24. The insulating film 46 is provided between the additional film 42 and the electrode fingers 23 and between the additional film 42 and the bus bar 24, and the additional film 42 is in direct contact with neither the electrode fingers 23 nor the bus bar 24. Other structures are the same as those of the first embodiment, and the description thereof is thus omitted.

A metal film such as aluminum or titanium may be used for the additional film 40. In this case, provision of the insulating films 46 between the additional films 40 and the electrode fingers 23 and between the additional films 40 and the bus bars 24 allows the additional films 40 to be electrically insulated from the electrode fingers 23 and the bus bars 24. Similarly, a metal film such as aluminum or titanium may be used for the additional film 42. In this case, provision of the insulating films 46 between the additional films 42 and the electrode fingers 23 and between the additional films 42 and the bus bars 24 allows the additional films 42 to be electrically insulated from the electrode fingers 23 and the bus bars 24.

Since the film thickness of the insulating film 46 is thin (for example, 0.1λ or less), even when the insulating film 46 is provided, the influence on the piston-mode excitation condition is negligible.

Also in the first variation of the first embodiment, the insulating films 46 may be provided between the additional films 42 and the electrode fingers 23 and between the additional films 42 and the bus bars 24 as in the second variation of the first embodiment.

Second Embodiment

Figure 12A:
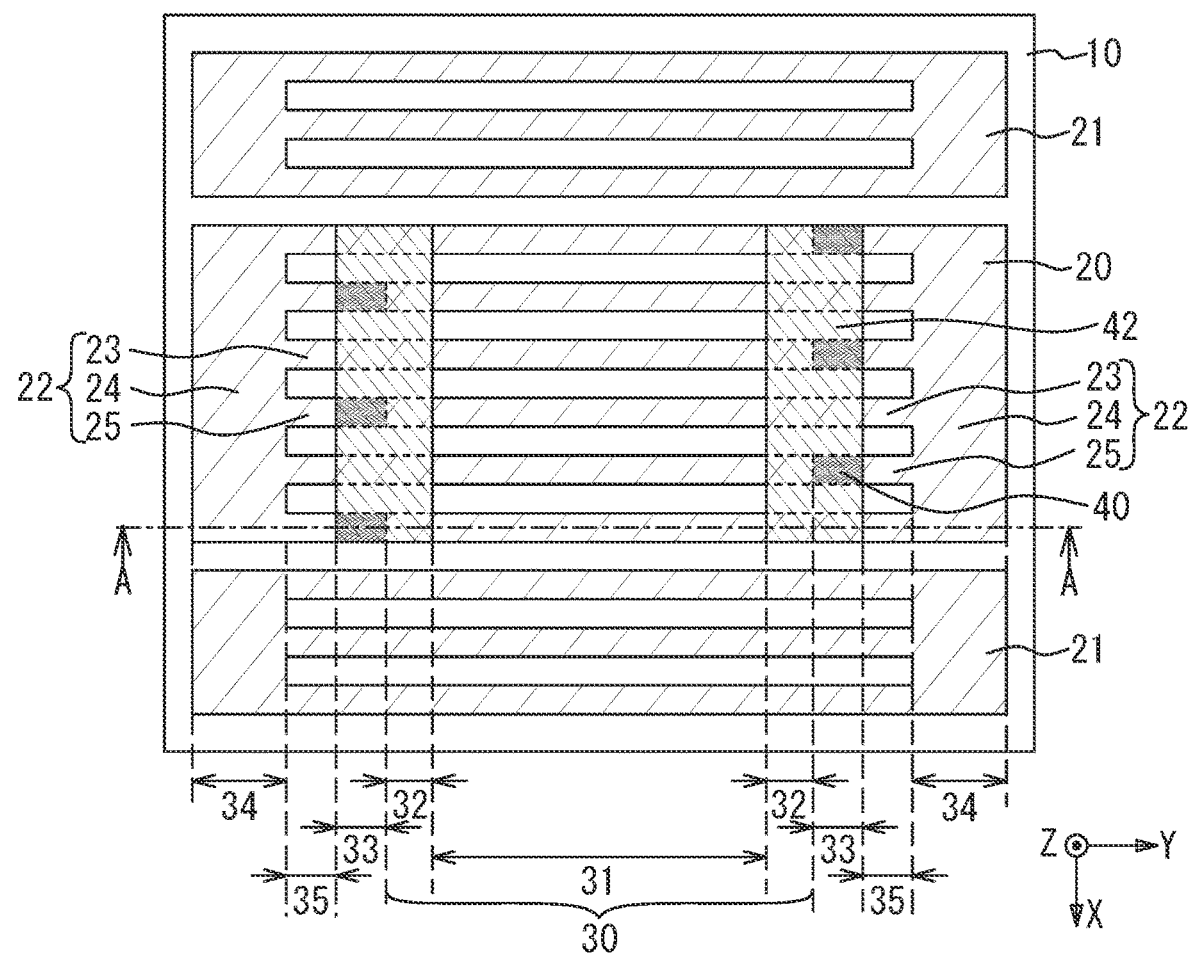
FIG. 12A is a plan view of an acoustic wave resonator in accordance with a second embodiment.
Figure 12B:
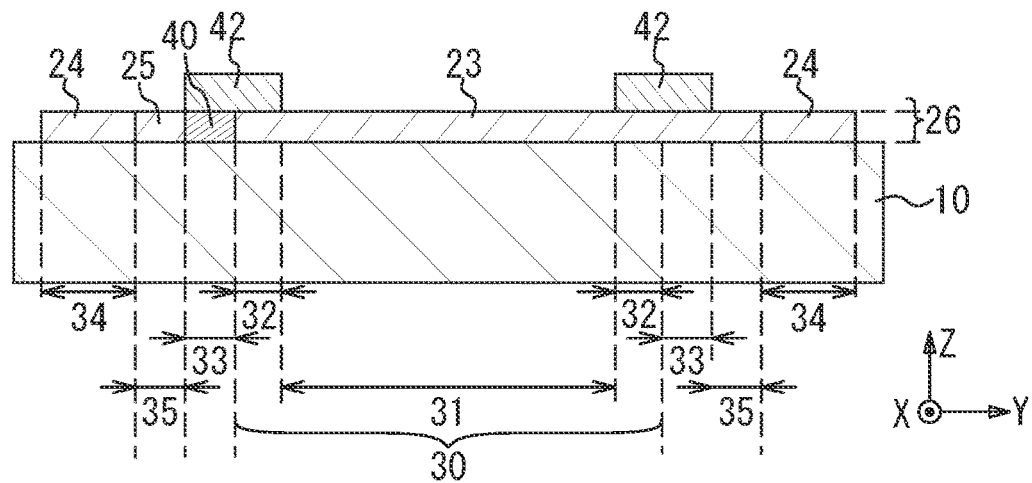
FIG. 12B is a cross-sectional view taken along line A-A in FIG. 12A.

FIG. 12A is a plan view of an acoustic wave resonator 200 in accordance with a second embodiment, and FIG. 12B is a cross-sectional view taken along line A-A in FIG. 12A. As illustrated in FIG. 12A and FIG. 12B, in the acoustic wave resonator 200, each of the comb-shaped electrodes 22 includes the electrode fingers 23, dummy electrode fingers 25, and the bus bar 24 to which the electrode fingers 23 and the dummy electrode fingers 25 are coupled. The tips of the electrode fingers 23 of one of the comb-shaped electrodes 22 are opposite to the tips of the dummy electrode fingers 25 of the other of the comb-shaped electrodes 22. The additional films 40 are provided on the piezoelectric substrate 10 between the tips of the electrode fingers 23 of one of the comb-shaped electrodes 22 and the tips of the dummy electrode fingers 25 of the other of the comb-shaped electrodes 22. No additional film 40 is provided on the adjacent electrode fingers 23 in the X direction and under the electrode fingers 23. The upper surface of the additional film 40 may be in the same plane as the upper surface of the electrode finger 23 and the upper surface of the dummy electrode finger 25, or there may be a level difference between the upper surface of the additional film 40 and the upper surface of the electrode finger 23 and between the upper surface of the additional film 40 and the upper surface of the dummy electrode finger 25. The additional film 40 may be thicker or thinner than the electrode finger 23 and the dummy electrode finger 25. The width of the additional film 40 in the X direction may be the same as the width of the electrode finger 23 in the X direction and the width of the dummy electrode finger 25 in the X direction, or may be greater or less than the width of the electrode finger 23 in the X direction and the width of the dummy electrode finger 25 in the X direction. The acoustic wave resonator 200 has dummy regions 35 between the gap regions 33 and the bus bar regions 34 in addition to the overlap region 30, which has the center region 31 and the edge regions 32, the gap regions 33, and the bus bar regions 34. The dummy electrode fingers 25 are located in the dummy region 35. Other structures are the same as those of the first embodiment, and the description thereof is thus omitted.

Figure 13A:
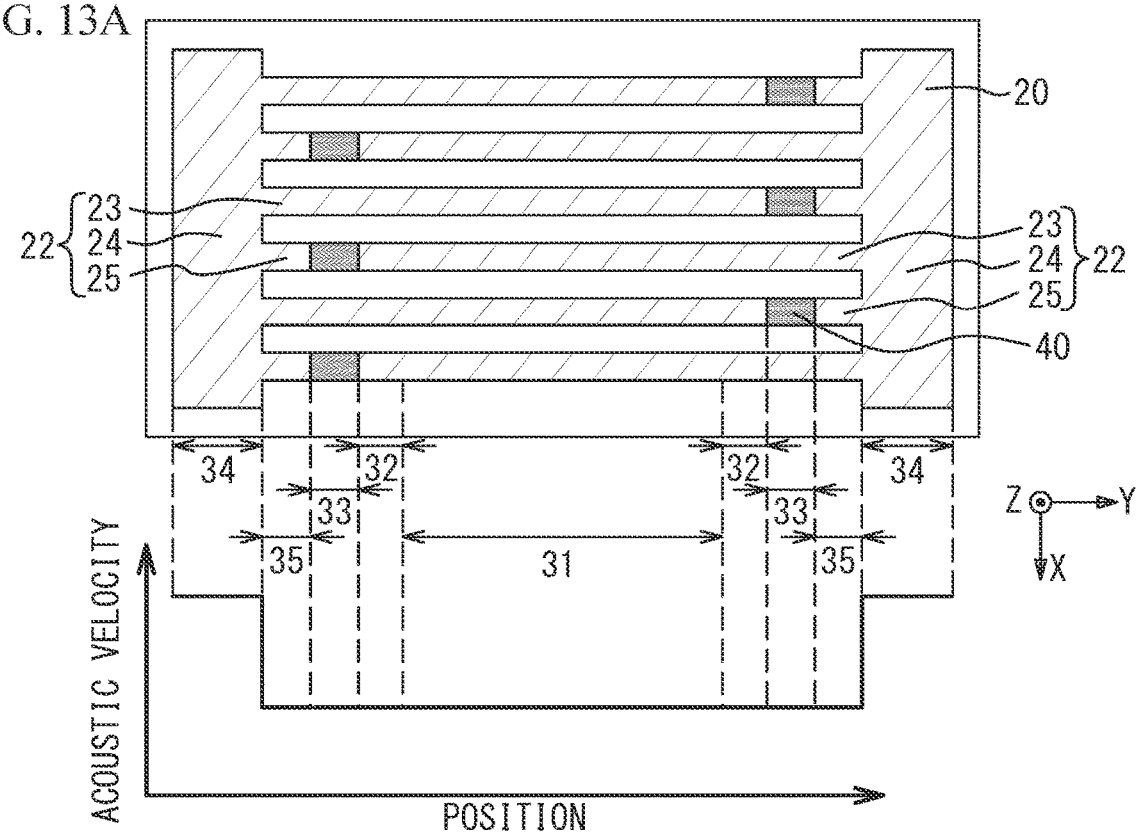
FIG. 13A and FIG. 13B illustrate the acoustic velocity of the acoustic wave in the IDT in the second embodiment.
Figure 13B:
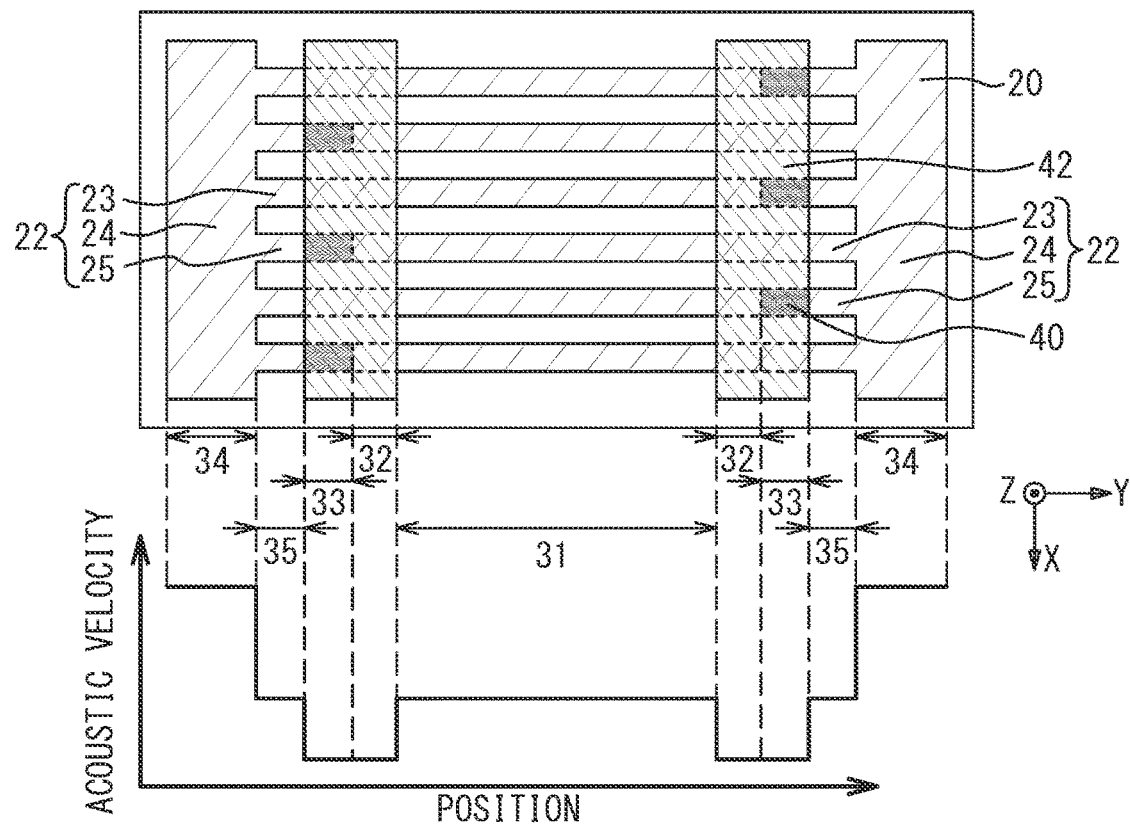

FIG. 13A and FIG. 13B illustrate the acoustic velocity of the acoustic wave in the IDT 20 in the second embodiment. FIG. 13A illustrates the state before the additional films 42 are provided, and FIG. 13B illustrates the state after the additional films 42 are provided. As illustrated in FIG. 13A, provision of the additional films 40 between the tips of the electrode fingers 23 and the tips of the dummy electrode fingers 25 makes the acoustic velocities of the surface acoustic waves propagating through the center region 31, the edge regions 32, the gap regions 33, and the dummy regions 35 substantially the same. In other words, provided are the additional films 40 of which the material, the thickness, and/or the width is adjusted so that the acoustic velocities of the surface acoustic waves propagating through the gap regions 33 are substantially the same as the acoustic velocities of the surface acoustic waves propagating through the center region 31, the edge regions 32, and the dummy regions 35.

As illustrated in FIG. 13B, provision of the additional films 42 from the respective edge regions 32 to the respective gap regions 33 makes the acoustic velocities of the surface acoustic waves propagating through the edge regions 32 and the gap regions 33 lower than the acoustic velocities of the surface acoustic waves propagating through the center region 31 and the dummy regions 35. That is, provided are the additional films 42 of which the material, the thickness, and/or the width is adjusted so that the acoustic velocities of the surface acoustic waves propagating through the edge regions 32 and the gap regions 33 are appropriately lower than the acoustic velocities of the surface acoustic waves propagating through the center region 31 and the dummy regions 35.

Since the additional films 40 make the acoustic velocities of the surface acoustic waves propagating through the gap regions 33 the same as the acoustic velocities of the surface acoustic waves propagating through the edge regions 32, even after the additional films 42 are provided, the acoustic velocities of the surface acoustic waves propagating through the gap regions 33 are substantially the same as the acoustic velocities of the surface acoustic waves propagating through the edge regions 32. The term "substantially the same" means that the acoustic velocities of the surface acoustic waves propagating through the gap regions 33 are equal to or greater than 0.98 times the acoustic velocities of the surface acoustic waves propagating through the edge regions 32 and equal to or less than 1.02 times the acoustic velocities of the surface acoustic waves propagating through the edge regions 32.

Simulation

A simulation to evaluate spurious emissions in the acoustic wave resonator 200 in accordance with the second embodiment was conducted. The simulation conditions are as follows.

Piezoelectric substrate 10: 42° Y-cut X-propagation lithium tantalate substrate

IDT 20 and the reflectors 21: Aluminum film with a thickness of 200 nm

Additional film 40: Silicon oxide film with a thickness of 228 nm

Additional film 42: Silicon oxide film with a thickness of 80 nm

Wavelength λ of the acoustic wave: 2 μm

Length of the edge region 32 in the Y direction: 0.7λ

Length of the gap region 33 in the Y direction: 1λ

Difference between the acoustic velocity in the edge region 32 and the acoustic velocity in the gap region 33: 0%

Difference between the acoustic velocity in the center region 31 and the acoustic velocity in the edge region 32: 2.5%

Figure 14:
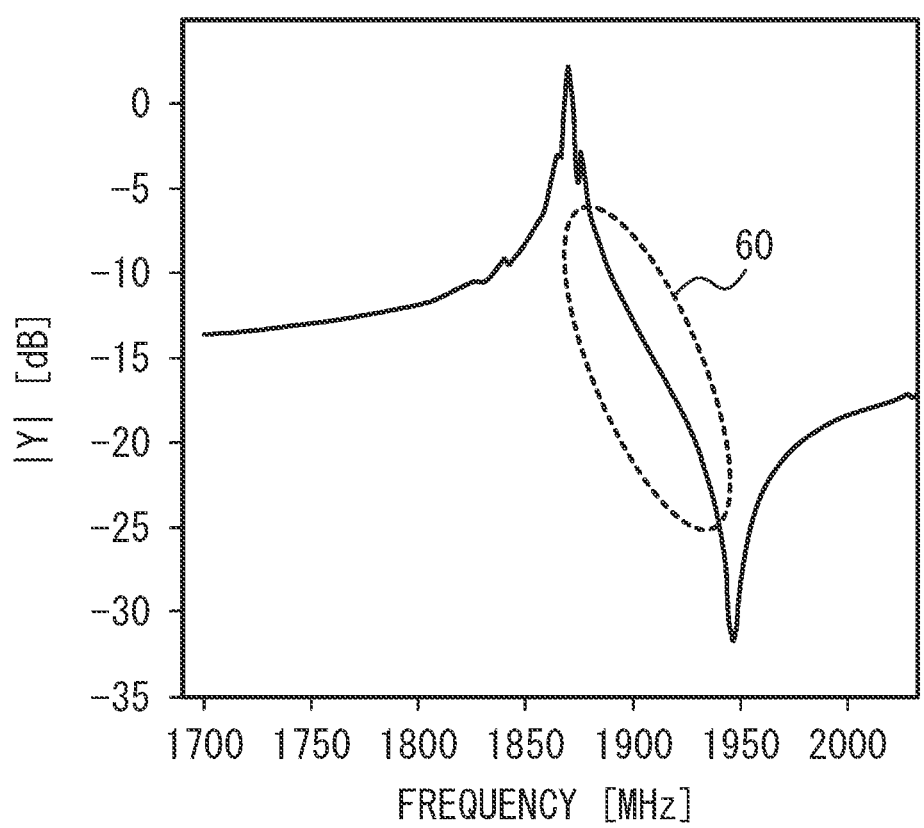
FIG. 14 presents simulation results of admittance |Y| with respect to frequency in the acoustic wave resonator in accordance with the second embodiment.

FIG. 14 presents simulation results of admittance |Y| with respect to frequency in the acoustic wave resonator 200 in accordance with the second embodiment. As presented in FIG. 14, for the acoustic wave resonator 200 in accordance with the second embodiment, the result in which the spurious emissions in a dashed line region 60 were reduced was obtained.

In the second embodiment, as illustrated in FIG. 13B, the acoustic velocities of the acoustic waves propagating through the gap regions 33 are equal to or greater than 0.98 times the acoustic velocities of the acoustic waves propagating through the edge regions 32 and equal to or less than 1.02 times the acoustic velocities of the acoustic waves propagating through the edge regions 32. The additional films 42 are provided from the respective edge regions 32 to the respective gap regions 33, and no additional film 42 is provided in the center region 31. Therefore, as in the first embodiment, independently from the length of the gap region 33 in the Y direction and the degree of the mass load effect of the additional film 42, the edge regions 32 and the gap regions 33 act as the low acoustic velocity regions, and the bus bar regions 34 act as the high acoustic velocity regions. Thus, the complexity of the adjustments to achieve the piston-mode excitation is reduced, and the piston-mode excitation can be easily achieved.

In the second embodiment, as illustrated in FIG. 12A and FIG. 12B, the additional films 40 are provided on the piezoelectric substrate 10 between the tips of the electrode fingers 23 and the tips of the dummy electrode fingers 25. This reduces the acoustic velocities of the acoustic waves propagating through the gap regions 33, and thereby, allows the acoustic velocities of the acoustic waves propagating through the gap regions 33 to be substantially the same as the acoustic velocities of the acoustic waves propagating through the edge regions 32.

Also in the second embodiment, the additional film 40 is a film mainly composed of silicon oxide, tantalum oxide, niobium oxide, aluminum, or titanium as in the first embodiment. Provision of such additional films 40 between the tips of the electrode fingers 23 and the tips of the dummy electrode fingers 25 allows the acoustic velocities of the acoustic waves propagating through the gap regions 33 to be substantially the same as the acoustic velocities of the acoustic waves propagating through the edge regions 32.

In the second embodiment, the acoustic velocities of the acoustic waves propagating through the bus bar regions 34 may be lower than acoustic velocities of the acoustic waves propagating through the center regions 31. In this case, by adjusting the acoustic velocities of the acoustic waves propagating through the dummy regions 35 to be higher than the acoustic velocities of the acoustic waves propagating through the center region 31, the piston-mode excitation is achieved.

In the first and second embodiments, the piezoelectric substrate 10 may be bonded to a support substrate. In this case, an insulating layer made of silicon oxide, aluminum oxide, and/or aluminum nitride may be provided between the piezoelectric substrate 10 and the support substrate.

Third Embodiment

Figure 15:
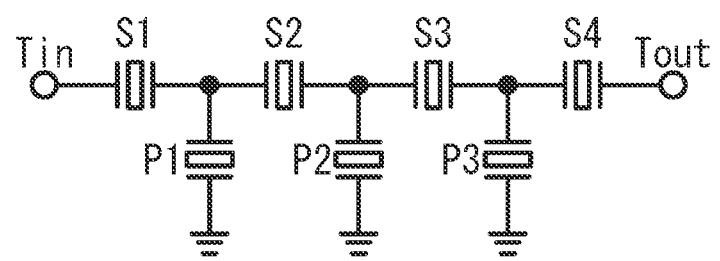
FIG. 15 is a circuit diagram of a filter in accordance with a third embodiment.

FIG. 15 is a circuit diagram of a filter 300 in accordance with a third embodiment. As illustrated in FIG. 15, in the filter 300, one or more series resonators S1 to S4 are connected in series between an input terminal Tin and an output terminal Tout, and one or more parallel resonators P1 to P3 are connected in parallel between the input terminal Tin and the output terminal Tout. The acoustic wave resonator according to any one of the first and second embodiments can be used for at least one of the following resonators: one or more series resonators S1 to S4 and one or more parallel resonators P1 to P3. The number of resonators in the ladder-type filter can be freely selected. The filter may be a multimode type filter.

Fourth Embodiment

Figure 16:
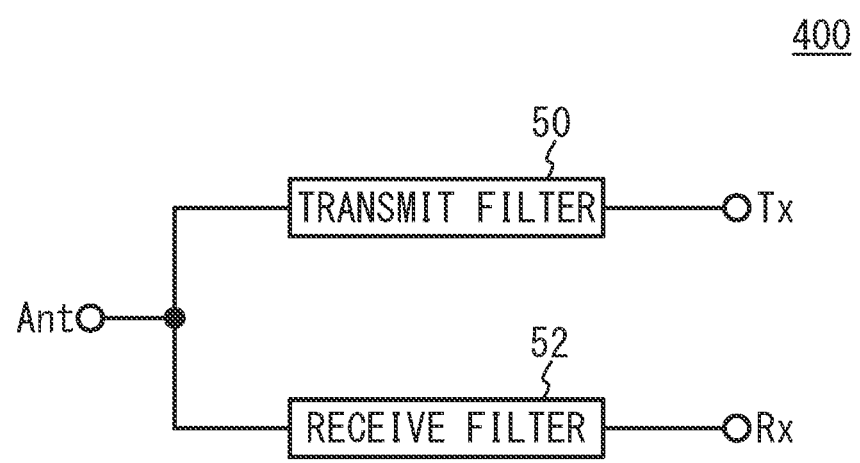
FIG. 16 is a block diagram of a duplexer in accordance with a fourth embodiment.

FIG. 16 is a block diagram of a duplexer 400 in accordance with a fourth embodiment. As illustrated in FIG. 16, in the duplexer 400, a transmit filter 50 is connected between a common terminal Ant and a transmit terminal Tx, and a receive filter 52 is connected between the common terminal Ant and a receive terminal Rx. The transmit filter 50 transmits signals in the transmit band to the common terminal Ant as transmission signals among high-frequency signals input from the transmit terminal Tx, and suppresses signals with other frequencies. The receive filter 52 transmits signals in the receive band to the receive terminal Rx as reception signals among high-frequency signals input from the common terminal Ant, and suppresses signals with other frequencies. At least one of the transmit filter 50 or the receive filter 52 may be the filter 300 in accordance with the third embodiment.

The duplexer has been described as an example of the multiplexer, but the multiplexer may be a triplexer or a quadplexer.

Although the embodiments of the present invention have been described in detail, the present invention is not limited to such a specific embodiment, and it is to be understood that the various change, substitutions, and alterations could be made hereto without departing from the spirit and scope of the invention.

What is claimed is:

1. An acoustic wave resonator comprising:
   a piezoelectric substrate;
   a pair of comb-shaped electrodes provided on the piezoelectric substrate, each of the comb-shaped electrodes including electrode fingers and a bus bar to which the electrode fingers are coupled, an acoustic velocity of an acoustic wave propagating through a gap region being equal to or greater than 0.98 times an acoustic velocity of an acoustic wave propagating through an edge region and equal to or less than 1.02 times the acoustic velocity of the acoustic wave propagating through the edge region, the gap region being a first region of a region located between tips of the electrode fingers of one of the comb-shaped electrodes and the bus bar of the other of the comb-shaped electrodes, the first region being provided with no metal film electrically connected to the bus bar of the other of the comb-shaped electrodes, the edge region being a region located in an edge in an extension direction of the electrode fingers in an overlap region, the overlap region being a region where the electrode fingers of the one of the comb-shaped electrodes and the electrode fingers of the other of the comb-shaped electrodes overlap; and
   an additional film that is provided over the piezoelectric substrate from the edge region to the gap region and is not provided in a center region that is a region located further in than the edge region in the overlap region,
   wherein in the pair of the comb-shaped electrodes, the acoustic velocity of the acoustic wave propagating through the edge region and the acoustic velocity of the acoustic wave propagating through the gap region are lower than an acoustic velocity of an acoustic wave propagating through the center region, and an acoustic velocity of an acoustic wave propagating through a bus bar region is higher than the acoustic velocity of the acoustic wave propagating through the center region, the bus bar region being a region where the bus bar is located.

2. The acoustic wave resonator according to claim 1, further comprising another additional film provided on the piezoelectric substrate in a part located between each of the tips of the electrode fingers of the one of the comb-shaped electrodes and the bus bar of the other of the comb-shaped electrodes and provided with no metal film electrically connected to the bus bar of the other of the comb-shaped electrodes.

3. The acoustic wave resonator according to claim 1,
   wherein the tips of the electrode fingers of the one of the comb-shaped electrodes are opposite to the bus bar of the other of the comb-shaped electrodes, and
   wherein the gap region is a region located between the tips of the electrode fingers of the one of the comb-shaped electrodes and the bus bar of the other of the comb-shaped electrodes.

4. The acoustic wave resonator according to claim 1,
   wherein each of the comb-shaped electrodes includes the electrode fingers, the bus bar, and dummy electrode fingers coupled to the bus bar,
   wherein the tips of the electrode fingers of the one of the comb-shaped electrodes and tips of the dummy electrode fingers of the other of the comb-shaped electrodes are opposite to each other, and
   wherein the gap region is a region located between the tips of the electrode fingers of the one of the comb-shaped electrodes and the tips of the dummy electrode fingers of the other of the comb-shaped electrodes.

5. The acoustic wave resonator according to claim 1, wherein a width of each of the electrode fingers in the gap region is greater than a width of each of the electrode fingers in the overlap region.

6. The acoustic wave resonator according to claim 1, wherein the acoustic velocity of the acoustic wave propagating through the gap region is equal to or greater than 0.98 times the acoustic velocity of the acoustic wave propagating through the edge region and equal to or less than 1.00 time the acoustic velocity of the acoustic wave propagating through the edge region.

7. The acoustic wave resonator according to claim 1, wherein a length of the gap region in an extension direction of the electrode fingers is equal to or less than two times an average pitch of the electrode fingers of the pair of the comb-shaped electrodes.

8. The acoustic wave resonator according to claim 1, wherein the piezoelectric substrate is a lithium tantalate substrate or a lithium niobate substrate.

9. An acoustic wave resonator comprising:
   a piezoelectric substrate;
   a pair of comb-shaped electrodes provided on the piezoelectric substrate, each of the comb-shaped electrodes including electrode fingers and a bus bar to which the electrode fingers are coupled, tips of the electrode fingers of one of the comb-shaped electrodes and the bus bar of the other of the comb-shaped electrodes being opposite to each other, the pair of the comb-shaped electrodes being mainly composed of aluminum;
   a first additional film that is provided on the piezoelectric substrate between each of the tips of the electrode fingers of the one of the comb-shaped electrodes and the bus bar of the other of the comb-shaped electrodes, and is mainly composed of silicon oxide; and
   a second additional film that is provided over the piezoelectric substrate from an edge region to a gap region, and is not provided in a center region, the edge region being a region located in an edge in an extension direction of the electrode fingers in an overlap region, the gap region being a region located between the tips of the electrode fingers of one of the comb-shaped electrodes and the bus bar of the other of the comb-shaped electrodes, the center region being a region located further in than the edge region in the overlap region, the overlap region being a region where the electrode fingers of the one of the comb-shaped electrodes and the electrode fingers of the other of the comb-shaped electrodes overlap,
   wherein $1.14 \times H \times W \leq S \leq 1.31 \times H \times W$ is satisfied where a thickness of each of the electrode fingers is represented by H, a width of each of the electrode fingers is represented by W, and an area of a cross-section parallel to an arrangement direction of the electrode fingers of the first additional film is represented by S.

10. The acoustic wave resonator according to claim 9, wherein a length of the gap region in an extension direction of the electrode fingers is equal to or less than two times an average pitch of the electrode fingers of the pair of the comb-shaped electrodes.

11. The acoustic wave resonator according to claim 9, wherein the piezoelectric substrate is a lithium tantalate substrate or a lithium niobate substrate.

12. An acoustic wave resonator comprising:
a piezoelectric substrate;
a pair of comb-shaped electrodes provided on the piezoelectric substrate, each of the comb-shaped electrodes including electrode fingers, dummy electrode fingers, and a bus bar to which the electrode fingers and the dummy electrode fingers are coupled, tips of the electrode fingers of one of the comb-shaped electrodes and tips of the dummy electrode fingers of the other of the comb-shaped electrodes being opposite to each other, the pair of the comb-shaped electrodes being mainly composed of aluminum;
a first additional film that is provided on the piezoelectric substrate between each of the tips of the electrode fingers of the one of the comb-shaped electrodes and a corresponding one of the tips of the dummy electrode fingers of the other of the comb-shaped electrodes, and is mainly composed of silicon oxide; and
a second additional film that is provided over the piezoelectric substrate from an edge region to a gap region, and is not provided in a center region, the edge region being a region located in an edge in an extension direction of the electrode fingers in an overlap region, the gap region being a region located between the tips of the electrode fingers of the one of the comb-shaped electrodes and the tips of the dummy electrode fingers of the other of the comb-shaped electrodes, the center region being a region located further in than the edge region in the overlap region, the overlap region being a region where the electrode fingers of the one of the comb-shaped electrodes and the electrode fingers of the other of the comb-shaped electrodes overlap,
wherein $1.14 \times H \times W \leq S \leq 1.31 \times H \times W$ is satisfied where a thickness of each of the electrode fingers is represented by H, a width of each of the electrode fingers is represented by W, and an area of a cross-section parallel to an arrangement direction of the electrode fingers of the first additional film is represented by S.

13. The acoustic wave resonator according to claim 12, wherein a length of the gap region in an extension direction of the electrode fingers is equal to or less than two times an average pitch of the electrode fingers of the pair of the comb-shaped electrodes.

14. The acoustic wave resonator according to claim 12, wherein the piezoelectric substrate is a lithium tantalate substrate or a lithium niobate substrate.

15. A filter comprising:
the acoustic wave resonator according to claim 1.

16. A multiplexer comprising:
the filter according to claim 15.

* * * * *